US008605815B2

(12) United States Patent
Utsunomiya et al.

(10) Patent No.: US 8,605,815 B2
(45) Date of Patent: Dec. 10, 2013

(54) DELAY AMOUNT ESTIMATING APPARATUS AND SIGNAL TRANSMITTING APPARATUS

(75) Inventors: Yuichi Utsunomiya, Kawasaki (JP);
Hiroyoshi Ishikawa, Kawasaki (JP);
Nobukazu Fudaba, Kawasaki (JP);
Hajime Hamada, Kawasaki (JP); Kazuo Nagatani, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1057 days.

(21) Appl. No.: 12/499,270

(22) Filed: Jul. 8, 2009

(65) Prior Publication Data

US 2010/0026354 A1   Feb. 4, 2010

(30) Foreign Application Priority Data

Jul. 29, 2008   (JP) .................................. 2008-195068

(51) Int. Cl.
*H04L 25/03*   (2006.01)

(52) U.S. Cl.
USPC ........................................................ 375/296

(58) Field of Classification Search
USPC .......... 375/285, 295–297; 332/106, 107, 123, 332/124, 125, 149, 160
See application file for complete search history.

(56) References Cited

U.S. PATENT DOCUMENTS

| | | | |
|---|---|---|---|
| 5,761,211 A | 6/1998 | Yamaguchi et al. | |
| 6,836,517 B2 | 12/2004 | Nagatani et al. | |
| 2001/0005402 A1 | 6/2001 | Nagatani et al. | |
| 2003/0072388 A1* | 4/2003 | Francos et al. | 375/296 |
| 2003/0179831 A1* | 9/2003 | Gupta et al. | 375/296 |
| 2005/0101258 A1* | 5/2005 | Kubo et al. | 455/67.13 |
| 2005/0129141 A1* | 6/2005 | Lee | 375/298 |
| 2005/0253745 A1* | 11/2005 | Song et al. | 341/118 |
| 2006/0008026 A1* | 1/2006 | Wood et al. | 375/296 |
| 2010/0188291 A1* | 7/2010 | Lamance, Jr. | 342/386 |

FOREIGN PATENT DOCUMENTS

| | | | |
|---|---|---|---|
| EP | 2149991 A2 * | 2/2010 | |
| JP | 9-64857 | 3/1997 | |
| JP | 2001-36429 | 2/2001 | |
| JP | 2001-189685 | 7/2001 | |

OTHER PUBLICATIONS

Chinese Second Office Action dated Oct. 24, 2012, from corresponding Chinese Application No. 200910159673.0.
Notification of Reason for Refusal dated May 29, 2012, from corresponding Japanese Application No. 2008-195068.

* cited by examiner

*Primary Examiner* — Tesfaldet Bocure
(74) *Attorney, Agent, or Firm* — Katten Muchin Rosenman LLP

(57) ABSTRACT

A delay amount estimating apparatus includes a delay value search section that searches for a first delay value smaller than a delay setting value at which a given correlation value between an input signal and a feedback signal is provided, and also for a second delay value greater than the delay setting value, the feedback signal coming from a signal processing apparatus that applies signal processing on the input signal, wherein respective correlation values of the first delay value and the second delay value satisfy a given condition; and a delay estimating section that estimates a delay amount of the feedback signal relative to the input signal based on the first delay value and the second delay value.

19 Claims, 16 Drawing Sheets

$$E\left[S(t_i)S'(t_i)^*\right]$$

$$=\sum\frac{S(t_i)\{\alpha S(t_i)e^{j\theta}\}^*}{n}$$

$$=\alpha e^{j\theta}\sum\frac{S(t_i)S(t_i)^*}{n}$$

$$=\alpha e^{j\theta}\sum\frac{(I+jQ)(I-jQ)}{n}$$

$$=\underbrace{\alpha e^{j\theta}}_{\text{COEFFICIENT}}\underbrace{\sum\frac{I^2+Q^2}{n}}_{\text{AVERAGE POWER}}$$

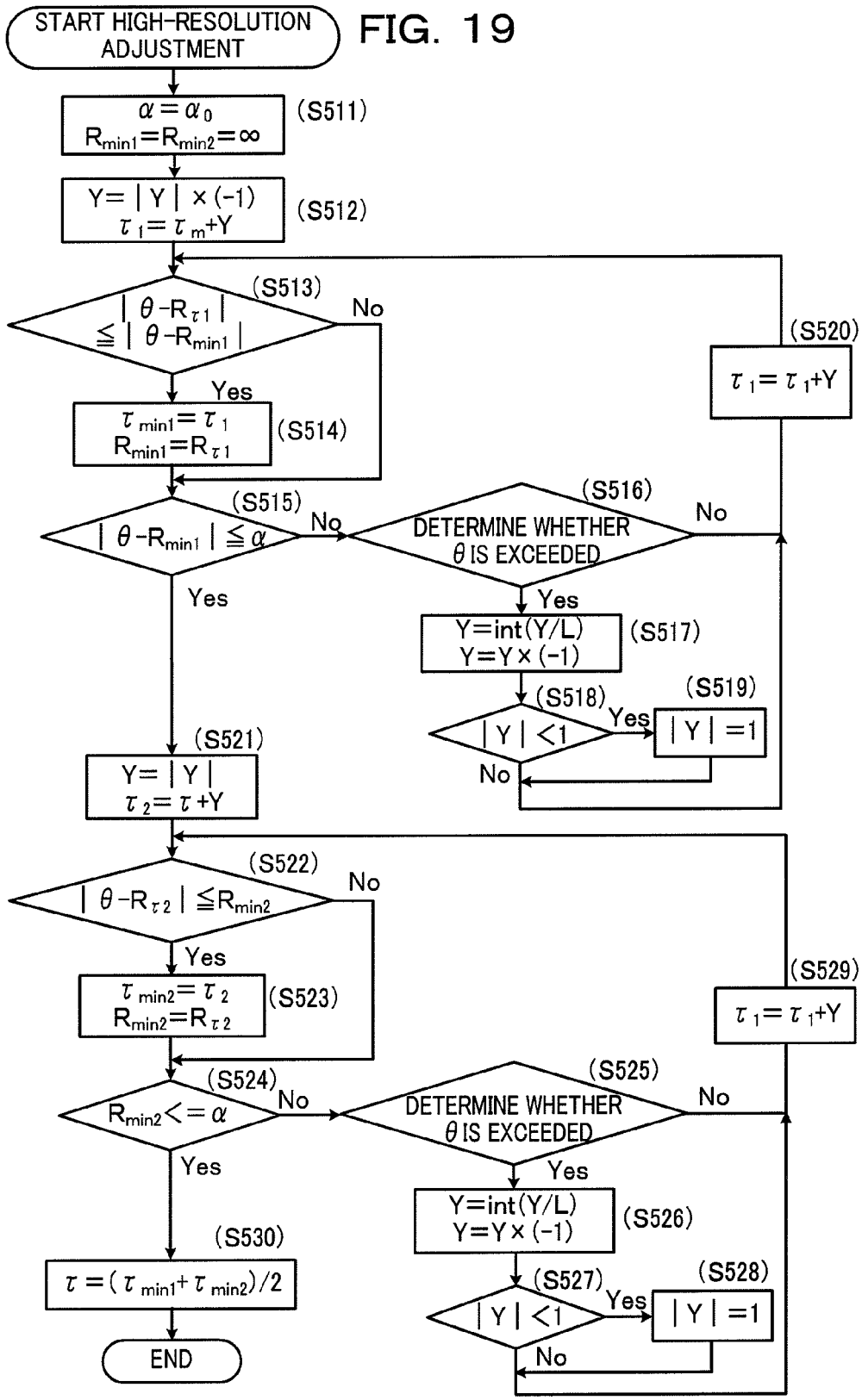

DELAY AMOUNT ESTIMATING APPARATUS AND SIGNAL TRANSMITTING APPARATUS

CROSS-REFERENCE TO RELATED APPLICATION

This application is based upon and claims the benefit of priority of the prior Japanese Patent Application No. 2008-195068, filed on Jul. 29, 2008, the entire contents of which are incorporated herein by reference.

FIELD

The present invention relates to a delay amount estimating apparatus and a method that estimates the delay amount of a feedback signal from a signal processing apparatus which processes an input signal and outputs the signal, and to a signal transmitting apparatus that transmits a signal.

BACKGROUND

In recent years, in the field of radio communication, frequency resources have become increasingly tight. Thus, high-efficient transmission using a digital modulation scheme is widely used. A radio communication apparatus using a digital modulation scheme typically includes a power amplifier used to amplify and output a modulated signal.

When the power amplifier is operated substantially at the saturation region, the usage efficiency of power is higher. However, when the power of an input signal is large, nonlinear distortion of an output signal occurs and thus the frequency spectrum becomes wider, causing leakage of the output signal power to adjacent channels. Accordingly, the radio communication apparatus includes a distortion correcting unit which corrects a distortion of the signal outputted from the power amplifier and thereby reduces a leakage of power to adjacent channels.

FIG. 1 is a schematic functional block diagram of a power amplifier and a distortion correcting unit.

FIG. 1 illustrates a power amplifier 10 used to amplify an input signal power and a distortion correcting unit used to correct a distortion of a signal outputted from the power amplifier 10. The distortion correcting unit includes a pre-distortion section 20, a delay adjusting section 30, and a delay amount estimating section 40.

The delay adjusting section 30 and the delay amount estimating section 40 receive an input signal S(t) and a feedback signal S(t−$\tau$) outputted from the power amplifier 10. The delay amount estimating section 40 estimates a delay amount $\tau$ of the feedback signal relative to the input signal, and the delay adjusting section 30 delays an input signal by the delay amount $\tau$ and sends the signal to the pre-distortion section 20. As a result, the input signal S(t) and the feedback signal S(t−$\tau$) are inputted to the pre-distortion section 20 at the same time. Further, the pre-distortion section 20 calculates a distortion correcting characteristic based on the input signal and feedback signal, and the input signal is multiplied by the calculated correcting characteristic, whereby the distortion of the signal outputted from the power amplifier 10 is reduced.

In radio communication systems, the signal power and bandwidth are regulated according to the user's system usage and the like, so the delay amount of the feedback signal outputted from the power amplifier 10 also fluctuates. Accordingly, in order to improve the distortion correcting performance by the pre-distortion section 20, the delay amount $\tau$ of the feedback signal relative to the input signal is preferably estimated with high accuracy.

Delay amount estimating methods hitherto proposed include: one for calculating a correlation value between the input signal and feedback signal while varying the delay amount, and determining as an optimal delay amount, a delay amount $\tau$ at which a maximum correlation value is provided (for example, refer to Japanese Patent Laid-Open No. 2001-189685); and one for using a delay amount obtained by varying, by a specific amount, a delay amount $\tau$ at which a maximum correlation value is provided (for example, refer to Japanese Patent Laid-Open No. 9-64857).

FIG. 2 is a view illustrating a relationship between the delay amount of the feedback signal relative to the input signal and the correlation value between the input signal and feedback signal.

Referring to FIG. 2, the abscissa represents the delay amount of the feedback signal relative to the input signal, and the ordinate represents the correlation value between the input signal and feedback signal.

In the delay amount estimating section 40 illustrated in FIG. 1, a correlation calculating section 42 calculates a correlation value between the input signal and feedback signal for each delay amount $\tau$ while varying, by a specific amount, the delay amount $\tau$ of the feedback signal relative to the input signal; and a maximum correlation value determining section 41 determines, as an optimal delay amount, a delay amount $\tau$m at which a maximum correlation value is provided.

However, in a region where the maximum correlation value is provided, the variance of a correlation value relative to the variance of the delay amount is smaller and thus calculation errors have much effect, causing a variation in correlation value. Consequently, a maximum correlation value cannot be determined with high accuracy, so it is difficult to determine an optimal delay amount when only a maximum correlation value is used.

The present invention addresses the above problem by providing a delay amount estimating apparatus and a signal transmitting apparatus in which a delay amount of a feedback signal relative to an input signal is estimated with high accuracy.

SUMMARY

According to an aspect of the embodiments discussed herein, a delay amount estimating apparatus includes a delay value search section that searches for a first delay value smaller than a delay setting value at which a given correlation value between an input signal and a feedback signal is provided, and also for a second delay value greater than the delay setting value, the feedback signal coming from a signal processing apparatus that applies signal processing on the input signal, wherein respective correlation values of the first delay value and the second delay value satisfy a given condition; and a delay estimating section that estimates a delay amount of the feedback signal relative to the input signal based on the first delay value and the second delay value.

It is to be understood that both the foregoing general description and the following detailed description are exemplary and explanatory and are not restrictive of the embodiments, as claimed.

BRIEF DESCRIPTION OF DRAWINGS

FIG. 19 is a flowchart illustrating a sequence of processes for high-speed high-resolution adjustment.

DESCRIPTION OF EMBODIMENTS

Figure 1:
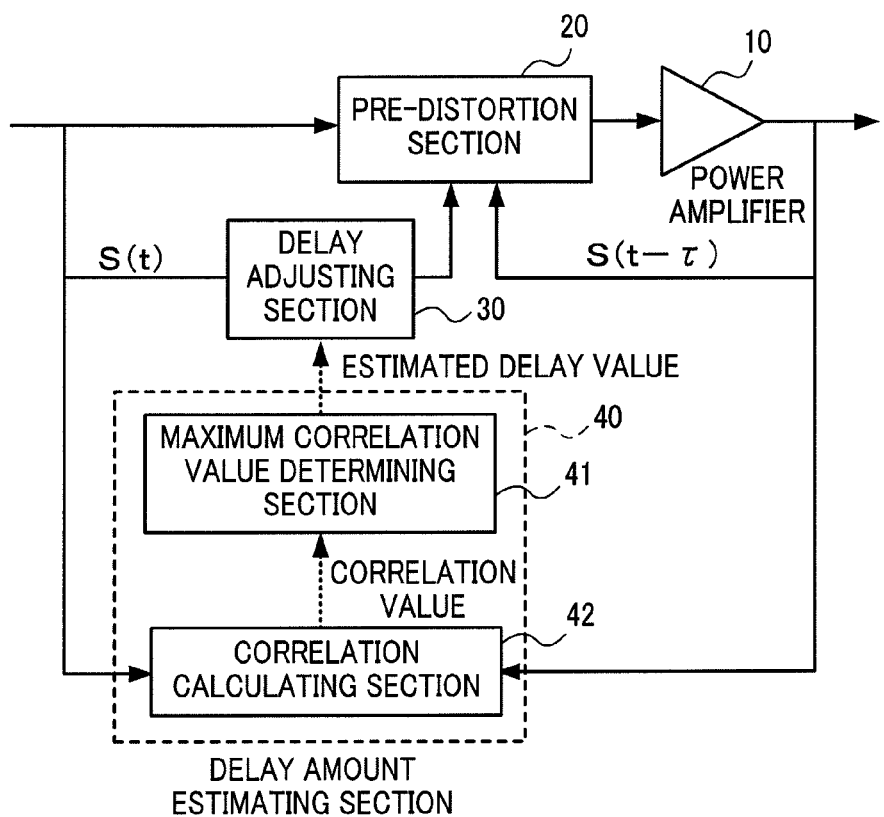
FIG. 1 is a schematic functional block diagram of a power amplifier and distortion correcting unit.
Figure 2:
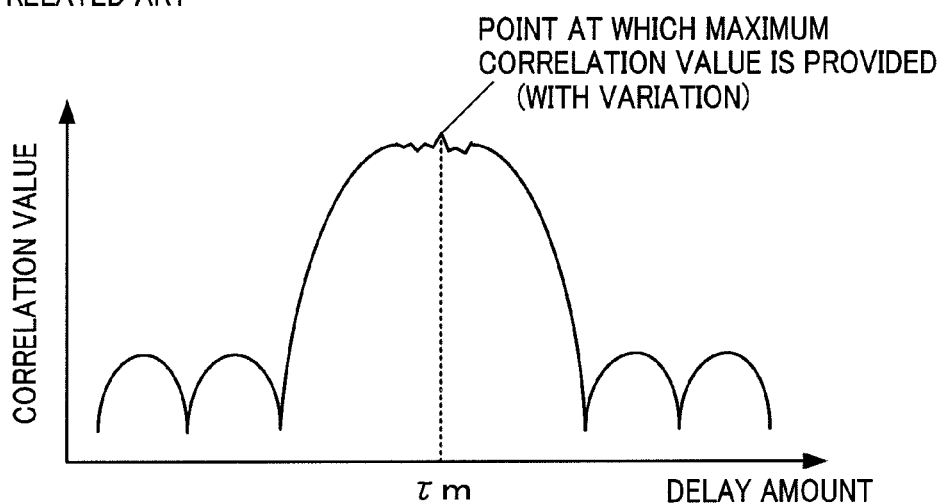
FIG. 2 is a view illustrating a relationship between the delay amount of the feedback signal relative to the input signal and the correlation value between the input signal and feedback signal.
Figure 3:
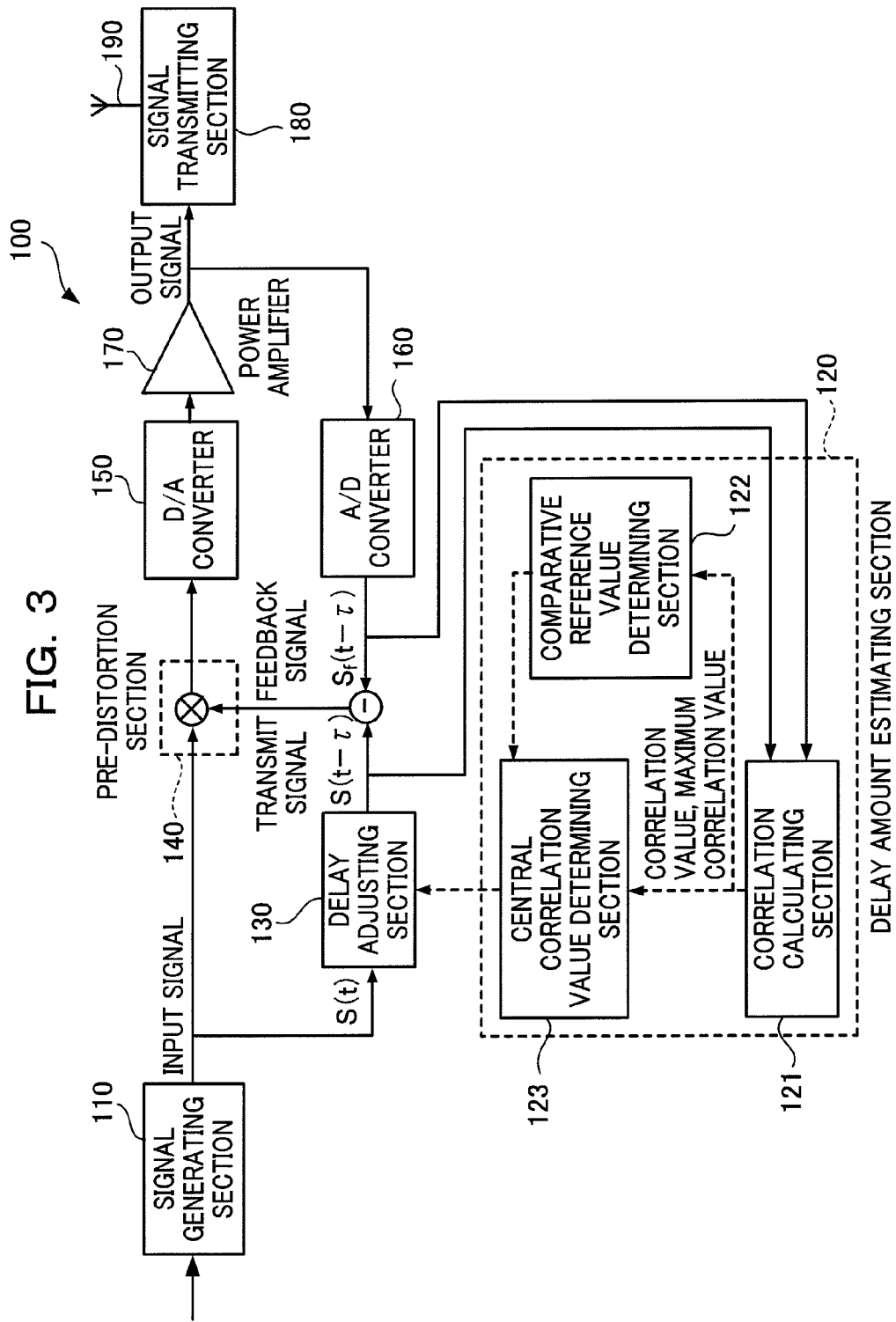
FIG. 3 is a schematic configuration diagram of a signal transmitting apparatus.

FIG. 3 is a schematic configuration diagram of a signal transmitting apparatus being one embodiment of the above-described delay amount estimating apparatus and signal transmitting apparatus.

A signal transmitting apparatus 100 includes, as illustrated in FIG. 3, a signal generating section 110, a delay estimating section 120, a delay adjusting section 130, a pre-distortion section 140, a D/A converter 150, an A/D converter 160, a signal amplifier 170, and a signal transmitting section 180. The signal generating section 110 generates an input signal. The delay estimating section 120 estimates a delay amount τ of a feedback signal Sf(t−τ) outputted from the signal amplifier 170 relative to the input signal S(t) generated by the signal generating section 110. The delay adjusting section 130 delays the input signal S(t) by the delay amount X estimated by the delay estimating section 120, and sends the signal to the pre-distortion section 140. The pre-distortion section 140 corrects the input signal based on the received input signal S(t) delayed and feedback signal Sf(t−τ) so that a signal with reduced non-linear distortion is outputted from the signal amplifier 170. The D/A converter 150 converts a digital signal into an analog signal. The A/D converter 160 converts an analog signal into a digital signal. The signal amplifier 170 amplifies a signal. The signal transmitting section 180 transmits the output signal from the signal amplifier 170 by use of an antenna 190.

The input signal S(t) generated by the signal generating section 110 is sent to the delay adjusting section 130 and also sent via the pre-distortion section 140 to the D/A converter 150 and, after being converted into an analog signal, sent to the power amplifier 170.

The power amplifier 170 amplifies the input signal S(t) and, after being converted into a digital signal in the A/D converter 160, the amplified signal is sent as the feedback signal Sf(t−τ) to the pre-distortion section 140 and the delay estimating section 120.

A correlation calculating section 121 of the delay estimating section 120 calculates a correlation value between the input signal and feedback signal while varying the delay amount of the feedback signal Sf(t−τ) relative to the input signal S(t). A comparative reference value determining section 122 of the delay estimating section 120 searches for a first delay value τ1 and a second delay value τ2 at which respective correlation values thus calculated are substantially equal to each other. A central correlation value determining section 123 of the delay estimating section 120 determines, as an optimum delay amount, a delay value being an intermediate value between the retrieved first delay value τ1 and the second delay value τ2. A method of calculating an optimum delay amount will be described in detail later. The delay estimating section 120 is an example of a delay estimating circuit; the comparative reference value determining section 122 is an example of a delay value search section; the central correlation value determining section 123 is an example of a delay estimating section.

The delay adjusting section 130 delays the input signal S(t) by the determined optimum delay amount and sends the resultant signal to the pre-distortion section 140. Consequently, the pre-distortion section 140 receives the input signal S(t−τ) and the feedback signal Sf(t−τ) at the same time. The delay adjusting section 130 is an example of a delay circuit.

The pre-distortion section 140 corrects the input signal based on the input signal S(t−τ) and the feedback signal Sf(t−τ) so that a signal with reduced non-linear distortion is outputted from the signal amplifier 170. After being corrected, the input signal S(t−τ) is converted into an analog signal and sent to the signal amplifier 170 and, after being amplified by the signal amplifier 170, transmitted via an antenna 190 by the signal transmitting section 180. The pre-distortion section 140 is an example of a distortion correcting circuit; the signal amplifier 170 is an example of an amplifier circuit; the signal transmitting section 180 is an example of a transmitting circuit.

The signal transmitting apparatus 100 has the above-described basic configuration.

A method of calculating an optimum delay amount will be described in detail.

Figure 4:
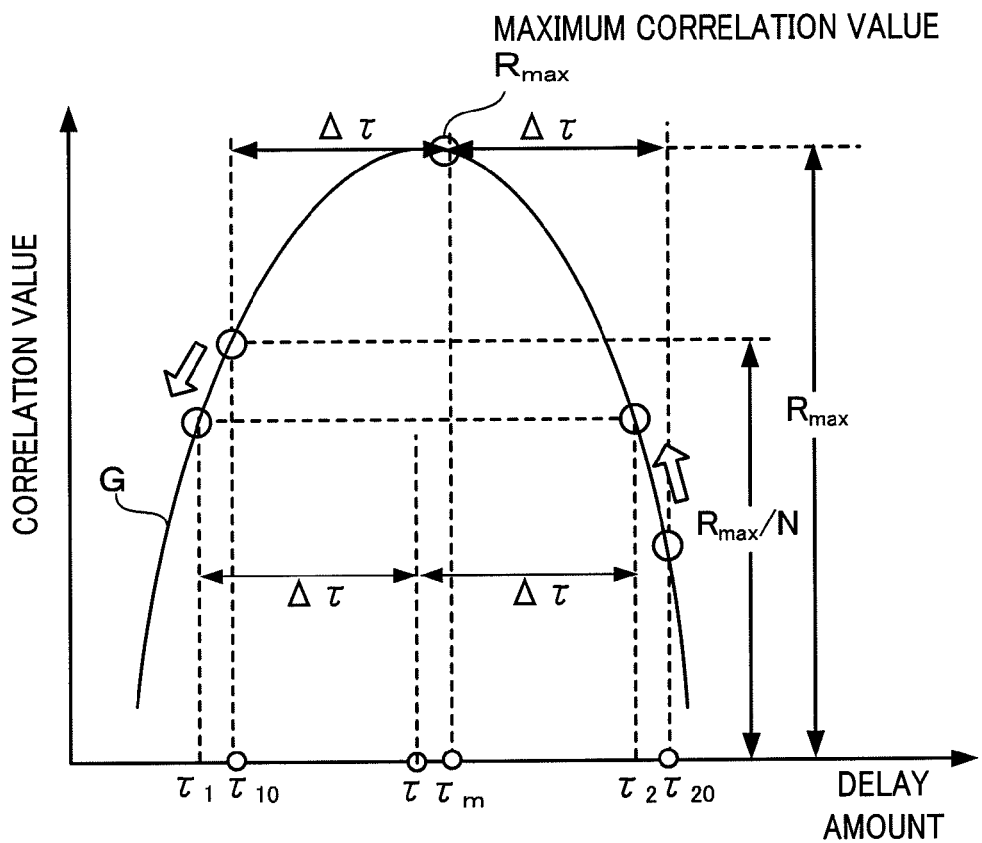
FIG. 4 is a view illustrating a method of calculating an optimal delay amount.
Figure 5:
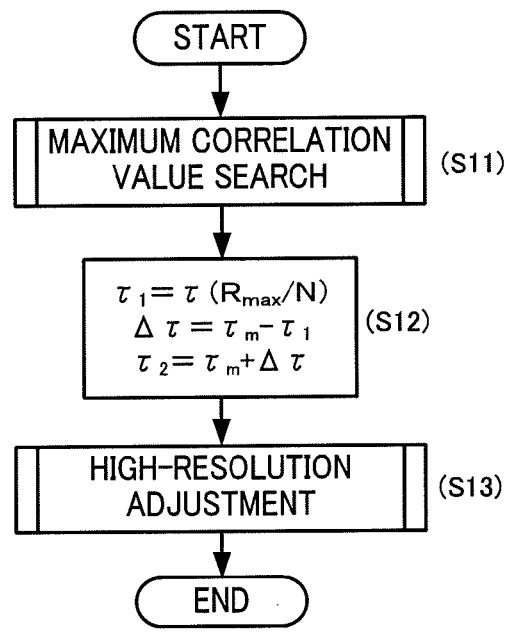
FIG. 5 is a flowchart illustrating a sequence of processes for calculating an optimal delay amount.

FIG. 4 is a view illustrating a method of calculating an optimum delay amount; and FIG. 5 is a flowchart illustrating a sequence of processes for calculating an optimum delay amount.

Referring to FIG. 4, the abscissa represents the delay amount of the feedback signal relative to the input signal; and the ordinate represents the correlation value between the input signal and feedback signal.

First, the correlation value calculating section 121 illustrated in FIG. 3 calculates a correlation value between the input signal S(t) and the feedback signal Sf(t−τ), whereby line G illustrated in FIG. 4 is extracted and also maximum correlation value Rmax is estimated (maximum correlation value search process S11 of FIG. 5).

Figure 6:
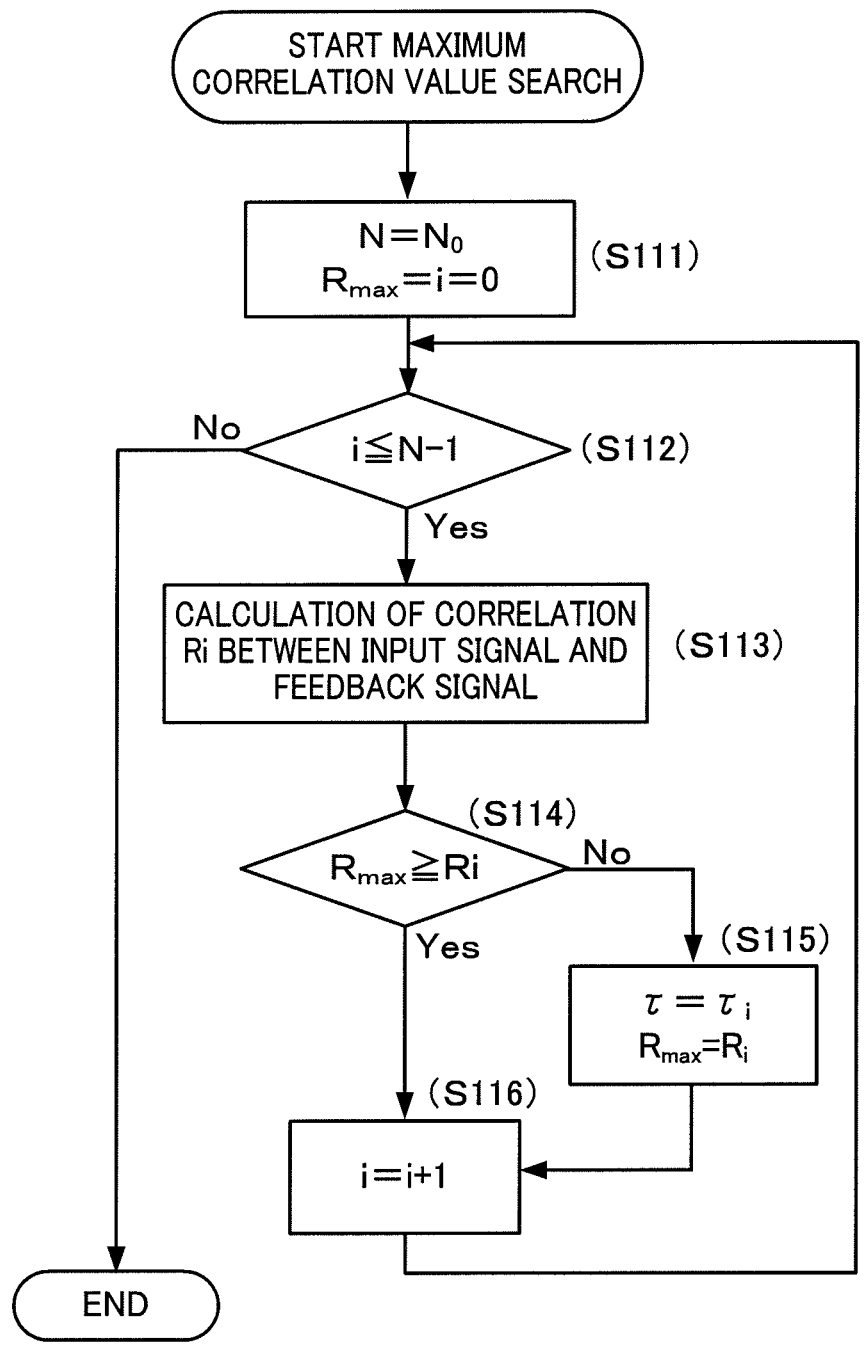
FIG. 6 is a flowchart illustrating a sequence of processes for searching for a maximum correlation value.

FIG. 6 is a flowchart illustrating a sequence of processes for searching for a maximum correlation value.

First, the number of search times N is set to a predetermined number $N_0$. The maximum correlation value Rmax and the current number of comparison times i are set to an initial number "0" (step S111 of FIG. 6).

Subsequently, if the current number of comparison times i is equal to or smaller than "N−1" which is a value one value before the prescribed number of times N (step S112 of FIG. 6: Yes), a correlation value Ri between the feedback signal Sf(t−τ) and the input signal S(t−τi), which are delayed only by the delay value τi corresponding to the number of comparison times i, is calculated (step S113 of FIG. 6).

If the maximum correlation value Rmax set at the current point is smaller than the correlation value Ri calculated in step S113 (step S114 of FIG. 6: No), the maximum correlation value Rmax is rewritten to the correlation value Ri, and a delay setting value τm, which is a delay value at which the maximum correlation value Rmax is provided, is set to the delay value τi of the correlation value Ri (step S115 of FIG. 6).

Subsequently, the current number of comparison times i is incremented (step S116 of FIG. 6).

The above processes are repeated until the current number of comparison times i reaches "N−1" which is a value one value before the prescribed number of times N (step S112 of FIG. 6: No), that is, are repeated a prescribed number of times "N", whereby the line G illustrated in FIG. 4 is provided and also the maximum correlation value Rmax and the delay setting value τm are estimated.

After completion of the maximum correlation value search process, the first delay value τ1 and the second delay value τ2 having the delay setting value τm therebetween are set by the comparative reference value determining section 122 illustrated in FIG. 3 (step S12 of FIG. 5). In this example, first, the comparative correlation value Rmax/N, which is 1/N times the maximum correlation value Rmax, is calculated, and the initial value τ10 of the first delay value τ1, which is smaller than delay setting value τm, is acquired. Further, a difference Δτ between the delay setting value τm and the initial value τ10 of the first delay value τ1 is calculated, and also the initial value τ20 of the second delay value τ2 obtained by adding the difference Δτ to the delay setting value τm is acquired. Thus, the first delay value τ1 (initial value τ10) and the second delay value τ2 (initial value τ20), which are on opposite sides of the delay setting value τm, are each separated from the delay setting value τm only by the difference Δτ Subsequently, the first delay value τ1 and the second delay value τ2 at which respective correlation values are equal to each other are found while the first delay value τ1 and the second delay value τ2 are shifted, whereby an intermediate delay value between the first delay value τ1 and the second delay value τ2 thus acquired is determined as the optimum delay amount τ (high-resolution adjustment process: step S13 of FIG. 5).

Here, relative to the above-described basic embodiment of delay amount estimating apparatus, an applied embodiment is preferably used which includes an initial delay value setting section that sets the first initial delay value τ10, which is an initial value of the first delay value τ1, and the second initial delay value τ20, which is an initial value of the second delay value τ2, and includes a delay value search section that searches for the first delay value τ1 and the second delay value τ2 at which respective correlation values are equal to each other, by varying at least one of the first delay value τ1 and the second delay value τ2 set by the initial delay value setting section.

According to the applied embodiment of the delay amount estimating apparatus, an intermediate delay value between two delay values at which the same correlation value is provided is determined as an optimum delay amount τ, so even when a maximum correlation value cannot be accurately detected due to a variation of correlation value, the delay amount can be calculated with high efficiency.

Figure 7:
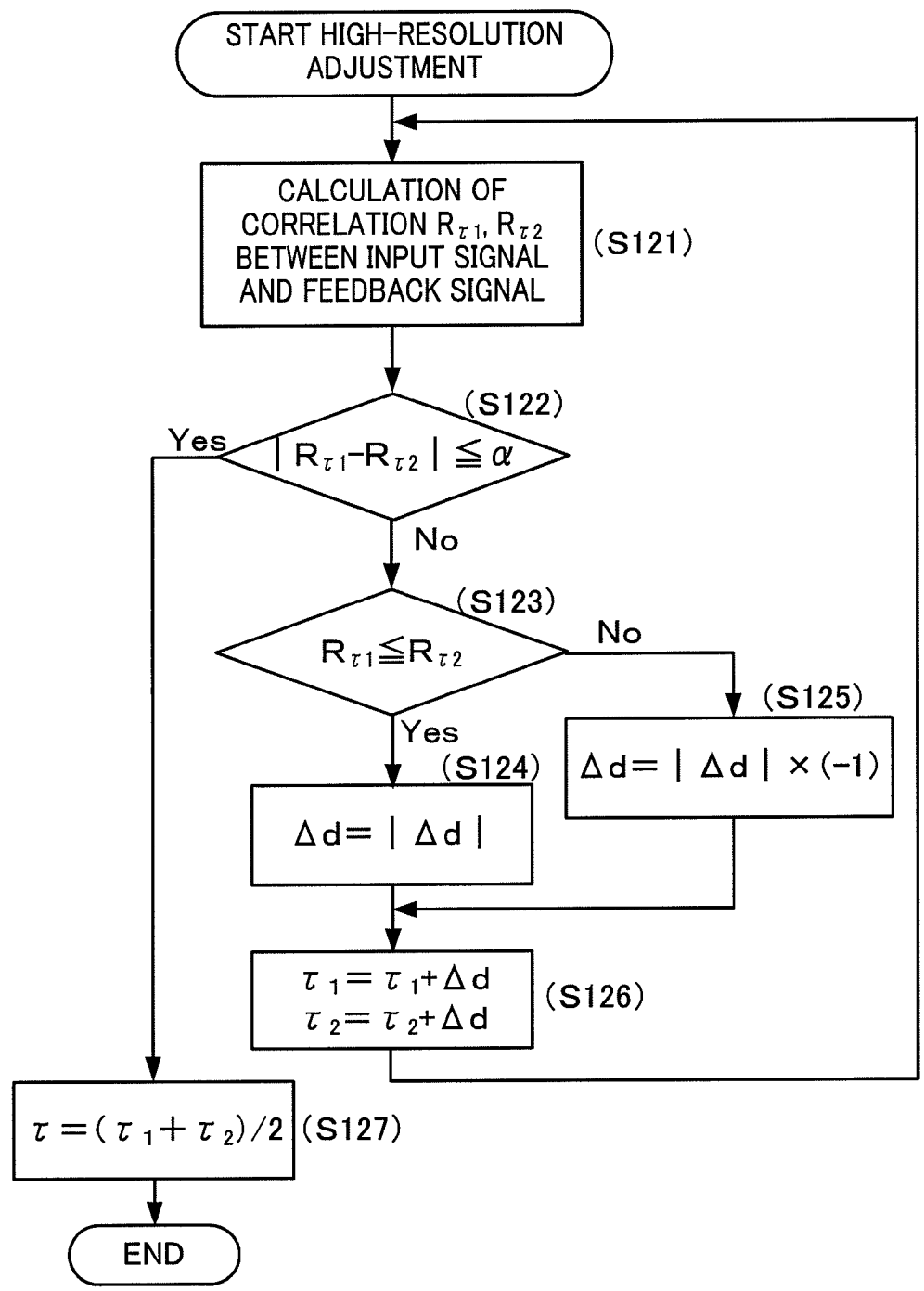
FIG. 7 is a flowchart illustrating a sequence of processes for high-resolution adjustment.

FIG. 7 is a flowchart illustrating a sequence of processes for a high-resolution adjustment.

In the high-resolution adjustment process, first, correlation values Rτ1 and Rτ2 corresponding respectively to the first delay value τ1 (initial value τ10) and the second delay value τ2 (initial value τ20) set in step S12 of FIG. 5 are acquired (step S121 of FIG. 7).

Subsequently, a difference between the acquired two correlation values Rτ1 and Rτ2 is calculated and then an absolute value |correlation value Rτ1−Rτ2| of the difference is compared with a given permissible value α (step S122 of FIG. 7). If the absolute value |correlation value Rτ1−Rτ2| of the two correlation values Rτ1 and Rτ2 is greater than the permissible value α (step S122 of FIG. 7: No) and the first correlation value Rτ1 of the first delay value τ1 is equal to or smaller than the second correlation value Rτ2 of the second delay value τ2 (step S123 of FIG. 7: Yes), a delay variation width Δd is set to a positive value (step S124 of FIG. 7). When the first correlation value Rτ1 is greater than the second correlation value Rτ2 (step S123 of FIG. 7: No), the delay variation width Δd is set to a negative value (step S125 of FIG. 7).

Subsequently, the delay variation width Δd is added to both the first delay value τ1 and the second delay value τ2 and the new first delay value τ1 and the second delay value τ2 are recalculated (step S126 of FIG. 7). Thus, the first correlation value Rτ1 and the second correlation value Rτ2 of the recalculated first delay value τ1 and second delay value τ2 are acquired (step S121 of FIG. 7). The processes are repeated until the absolute value of the difference between the first correlation value Rτ1 and the second correlation value Rτ2 becomes equal to or smaller than the permissible value α (step S122 of FIG. 7).

In the high-resolution adjustment processing, referring to line G illustrated in FIG. 4, first, the first delay value τ1 and the second delay value τ2 having the same distance from the delay setting value τm at which the maximum correlation value Rmax is provided are acquired. Then, with a fixed delay value width, the first delay value τ1 and the second delay value τ2 are varied, whereby the first delay value τ1 and the second delay value τ2 at which respective correlation values are equal to each other may be found.

Finally, after the first delay value τ1 and the second delay value τ2 have been acquired, the central correlation value determining section 123 of FIG. 3 determines, as the optimum delay amount, an intermediate delay value (τ1+τ2)/2 between the first delay value τ1 and the second delay value τ2 (step S127 of FIG. 7).

Here, relative to the above-described applied embodiment of delay amount estimating apparatus, an applied embodiment may be preferably used which includes a maximum correlation value calculating section that makes a calculation of the correlation between the input signal and the feedback signal and thereby calculates a maximum correlation value. Also, the initial delay value setting section sets, as one of the first initial delay value τ10 and the second initial delay value τ20, a delay value at which a comparative correlation value set based on the maximum correlation value calculated by the maximum correlation value calculating section is provided, and sets, as the other initial delay value, a delay value separated from the delay setting value at which the maximum correlation value is provided by the same delay width as a width from the delay setting value to the one initial delay value in an opposite direction relative to the one initial delay value. Further, an applied embodiment may also be preferably used in which the delay value search section varies the first delay value τ1 and the second delay value τ2 while the delay value width (τ2−τ1) between first delay value τ1 and second delay value τ2 is fixed at the delay value width (τ20−τ10), which is a difference between first initial delay value τ10 and second initial delay value τ20 set by the initial delay value setting section, and finds the first delay value τ1 and the second delay value τ2 at which respective correlation values are equal to each other.

According to the applied embodiments, the delay amount of the feedback signal relative to the input signal may be estimated with high efficiency and accuracy.

As described above, two delay values τ1 and τ2 at which the same correlation value is provided are found, and an intermediate delay value therebetween is determined as an optimum delay amount, whereby the delay amount of the feedback signal relative to the input signal can be estimated with high accuracy and thus the distortion of the output signal from the power amplifier 170 may be corrected accurately.

The above description is about the first embodiment. Now, a second embodiment will be described. The second embodiment has the same configuration as the first embodiment, but is different from the first embodiment only in methods for the maximum correlation value search processes and high-resolution adjustment processes. Accordingly, FIG. 3 is used again for description of the second embodiment, and only the differences will be described below.

Figure 8:
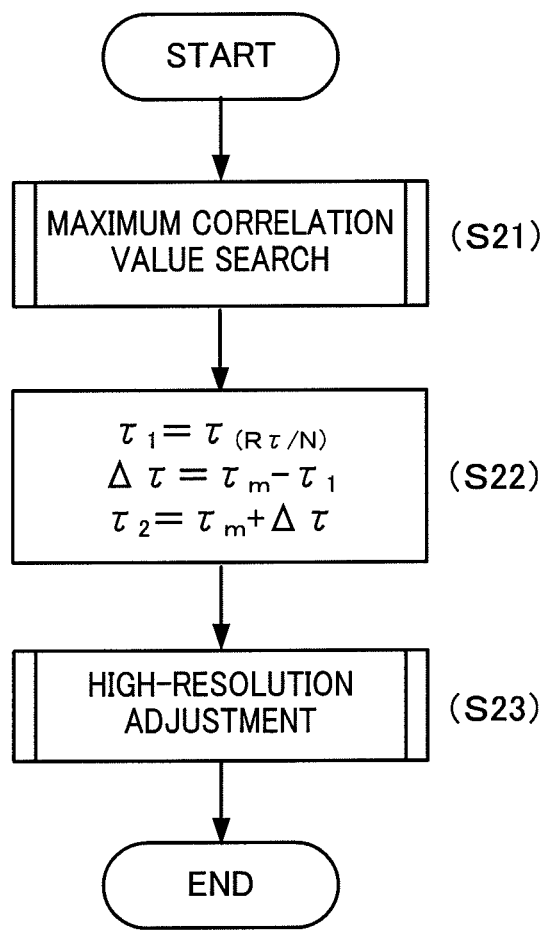
FIG. 8 is a flowchart illustrating a sequence of processes for calculating an optimal delay amount according to a second embodiment.

FIG. 8 is a flowchart illustrating a sequence of processes for calculating an optimum delay amount according to the second embodiment.

According to the present embodiment, similar to the first embodiment illustrated in FIG. 5, first the maximum correlation value search processes are executed by the correlation value calculating section 121 illustrated in FIG. 3 (step S21 of FIG. 8).

Figure 9:
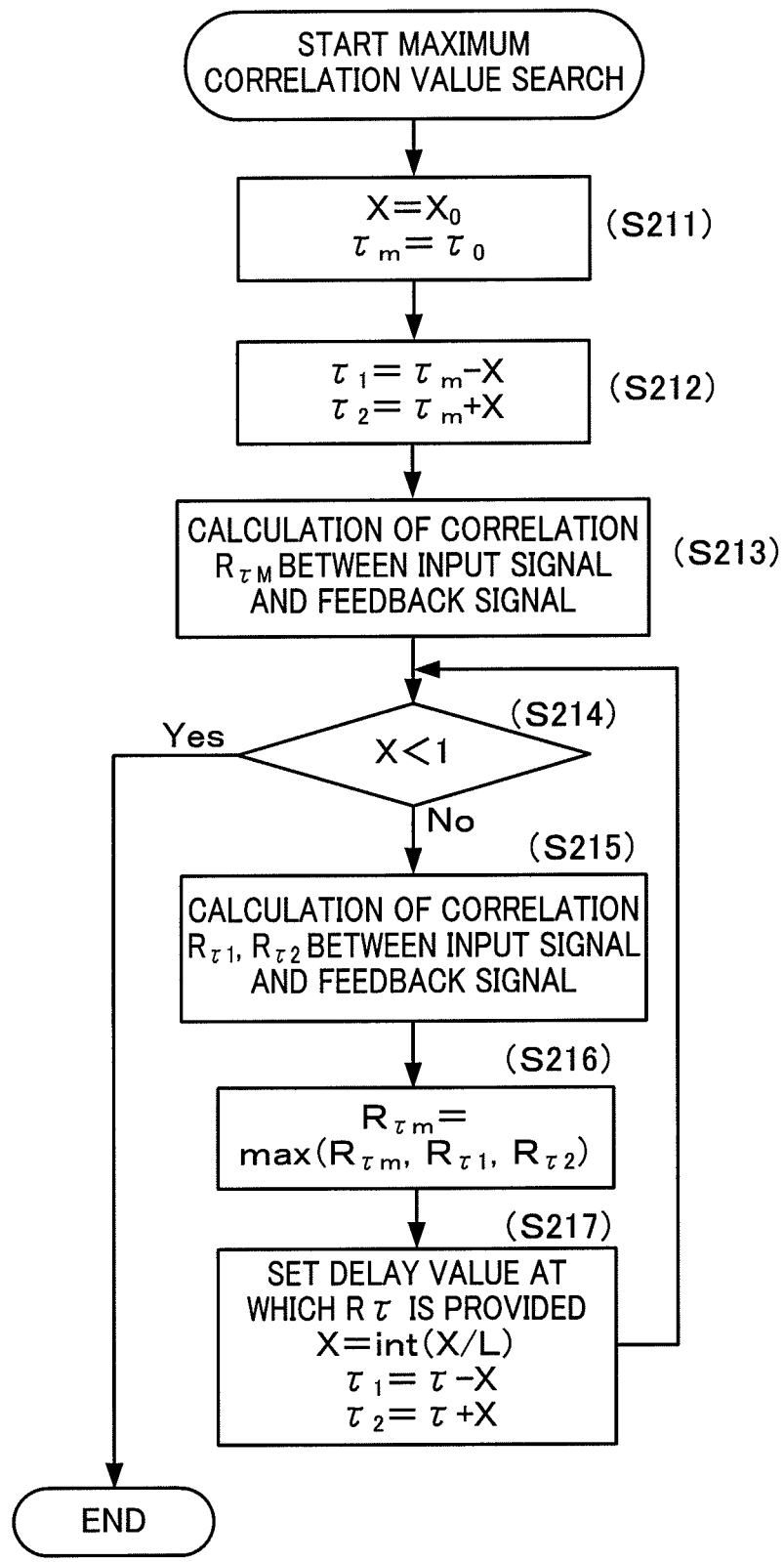
FIG. 9 is a flowchart illustrating a sequence of processes for searching for a maximum correlation value according to the second embodiment.

FIG. 9 is a flowchart illustrating a sequence of the processes for searching for a maximum correlation value according to the second embodiment.

In the maximum correlation value search process of the second embodiment, the process of calculating the correlation values of the input signal and the feedback signal point by point while changing the delay value of the feedback signal relative to the input signal to extract line G is omitted. First, the delay setting value τm (initial value τ0) at which maximum correlation value Rmax is provided and the delay value varying width X for changing a delay value (initial value X0) are temporarily set (step S211 of FIG. 9).

Subsequently, the first delay value τ1 (τ1=τm−X), which is separated by a delay value varying width X from the delay setting value τm, and the second delay value τ2 (τ2=τm+X) are calculated, the temporary delay setting value τm being between the first delay value τ1 and the second delay value τ2 (step S212 of FIG. 9).

Then, a correlation value Rτm between the input signal and the feedback signal when the delay value of the feedback signal relative to the input signal is delay setting value τm is calculated (step S213 of FIG. 9). When the delay value varying width X is equal to or greater than "1" (step S214 of FIG. 9: No), correlation values Rτ1 and Rτ2 between the input signal and the feedback signal corresponding respectively to the first delay value τ1 and the second delay value τ2 are also calculated (step S215 of FIG. 9).

Figure 10:
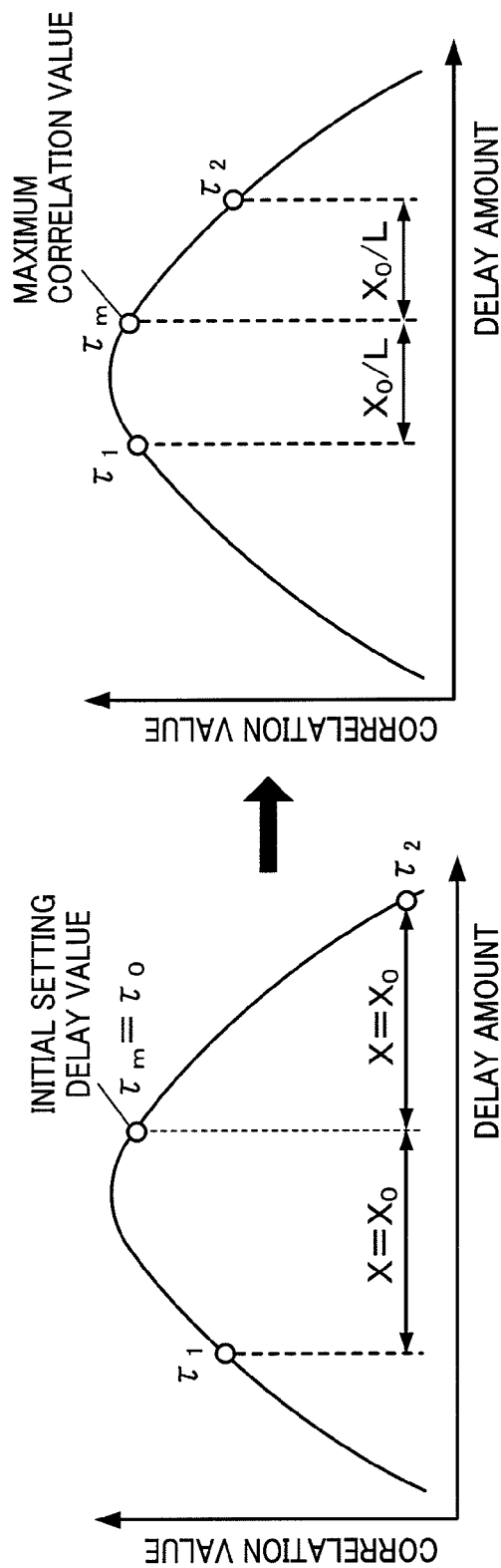
FIGS. 10A and 10B are views illustrating a process for searching for a maximum correlation value according to the second embodiment.

FIGS. 10A and 10B are views illustrating a process for searching for a maximum correlation value according to the present embodiment.

In step S215 of FIG. 9, as illustrated in FIG. 10A, the temporary delay setting value τm, and the first delay value τ1 and the second delay value τ2 each separated by the delay value varying width X from the temporary delay setting value τm are extracted, and correlation values Rτm, Rτ1, and Rτ2 at three respective delay values τm, τ1, and τ2 are calculated. Although a line G similar to the one of FIG. 4 is illustrated in FIGS. 10A and 10B according to the present embodiment, line G is not actually drawn and only calculations for several desired points are executed.

After the calculation of the correlation values Rτm, Rτ1, and Rτ2 of the three delay values τm, τ1, and τ2, a maximum value among the correlation values Rτm, Rτ1, and Rτ2 is found, and the correlation value thus acquired is determined to be the new maximum correlation value Rτm (step S216 of FIG. 9). Referring to the example illustrated in FIG. 10A, the previous maximum correlation value Rτm among the three correlation values Rτm, Rτ1, and Rτ2 is determined to be the new maximum correlation value Rτm.

Subsequently, the delay value varying width X is multiplied by 1/L (L being an integer greater than 1), and using the new delay value varying width X and the delay setting value τm at which new maximum correlation value Rτm is provided, the first delay value τ1 and the second delay value τ2 separated from the delay setting value τm by the delay value varying width X are calculated (step S217 of FIG. 9).

If the new delay value varying width X is equal to or greater than "1" (step S214 of FIG. 9: No), the correlation values Rτ1 and Rτ2 at the new first delay value τ1 and second delay value τ2 are calculated (step S215 of FIG. 9), and a maximum value is found among the correlation values Rτm, Rτ1, and Rτ2 (step S216 of FIG. 9).

The above process is repeated until the delay value varying width X becomes smaller than 1.

According to the present embodiment, as illustrated in FIG. 10B, the process of multiplying the delay value varying width X by 1/L is repeated, whereby the search range of the maximum correlation value is gradually narrowed and finally a maximum correlation value is selected from among three adjacent points, so that the correlation value Rτm is determined as the maximum correlation value Rmax.

In this way, according to the maximum correlation value searching process illustrated in FIG. 9, the process of calculating the correlation values of the input signal and the feedback signal point by point while changing the delay value of the feedback signal relative to the input signal to extract the line G may be omitted, and thus finding the maximum correlation value quickly is possible.

After completion of the maximum correlation value search processes, similar to the first embodiment illustrated in FIG. 5, a comparative correlation value Rmax/N obtained by multiplying the maximum correlation value Rmax by 1/N is calculated, and the first delay value τ1 and second delay value τ2 each separated by the difference Δτ from the delay setting value τm are set, delay setting value τm being between the first delay value τ1 and the second delay value τ2 (step S22 of FIG. 8).

Subsequently, a high-resolution adjustment process of determining the optimum delay amount τ is executed (step S23 of FIG. 8).

Figure 11:
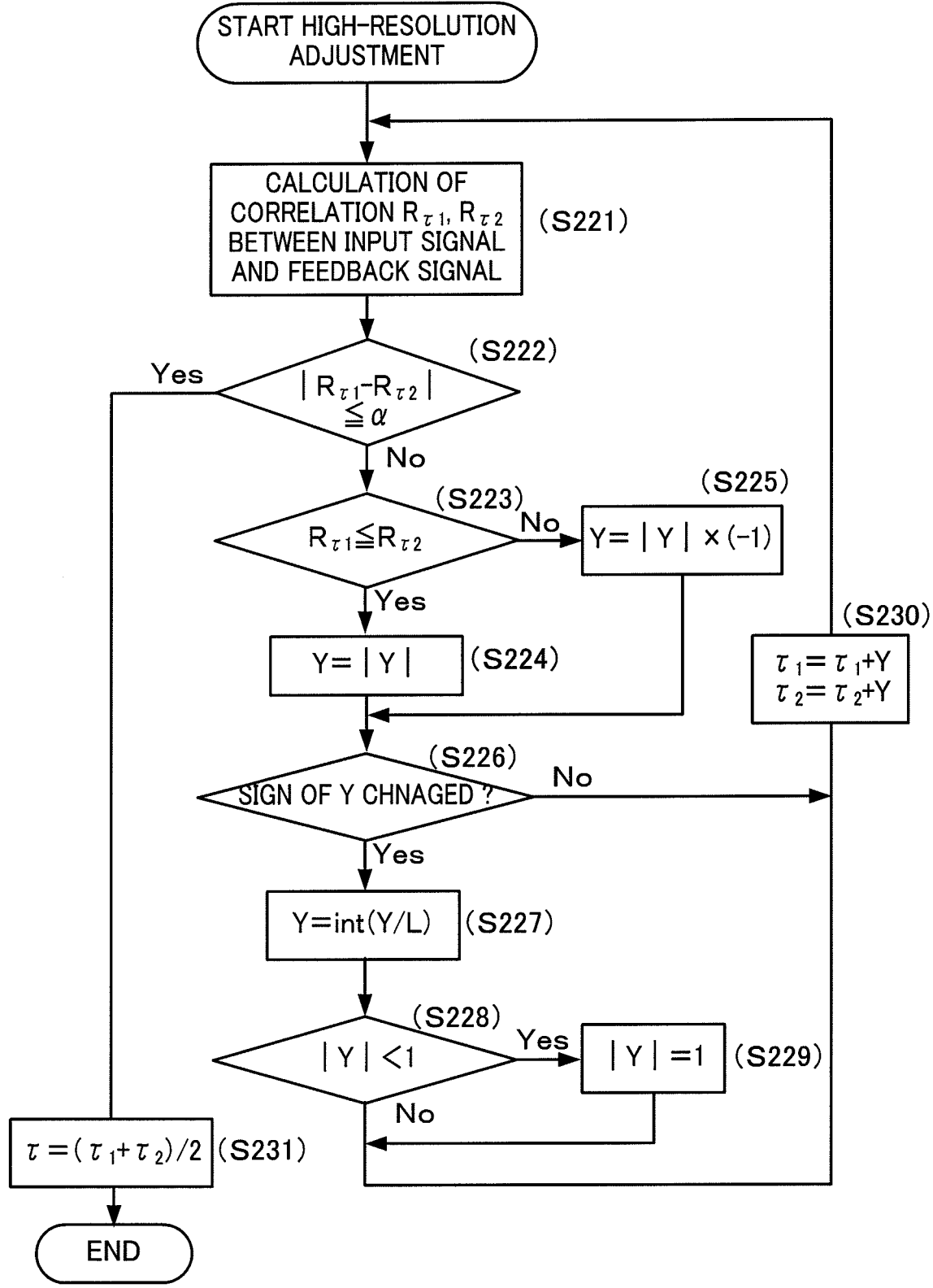
FIG. 11 is a flowchart illustrating a sequence of processes for high-resolution adjustment according to the second embodiment.

FIG. 11 is a flowchart illustrating a sequence of processes for high-resolution adjustment according to the second embodiment.

In the high-resolution adjustment processes of the present embodiment, also, similar to the first embodiment illustrated in FIG. 7, correlation values $R\tau1$ and $R\tau2$ of the first delay value $\tau1$ and second delay value $\tau2$ set in the maximum correlation value search processes are acquired (step S221 of FIG. 11). If the absolute value $|R\tau1-R\tau2|$ of the difference between correlation values $R\tau1$ and $R\tau2$ is greater than the given permissible value $\alpha$ (step S222 of FIG. 11: No), correlation values $R\tau1$ and $R\tau2$ are compared to each other.

If the first correlation value $R\tau1$ of the first delay value $\tau1$ is equal to or smaller than the second correlation value $R\tau2$ of the second initial delay value $\tau2$ (step S223 of FIG. 11: Yes), a given delay varying width Y is set to a positive value (step S224 of FIG. 11). If the first correlation value $R\tau1$ is greater than the second correlation value $R\tau2$ (step S223 of FIG. 11: No), the delay varying width Y is set to a negative value (step S225 of FIG. 11).

If the sign of the delay varying width Y does not change through steps S223 and S225 (step S226 of FIG. 11: No), the magnitude of the delay varying width Y does not change; and if the sign of the delay varying width Y does change (step S226 of FIG. 11: Yes), the delay varying width Y is multiplied by 1/L (L being an integer greater than 1) (step S227 of FIG. 11); and further, if the absolute value of the varied delay varying width Y is smaller than "1" (step S228 of FIG. 11: Yes), only the absolute value of the delay varying width Y is changed to "1" with the sign thereof unchanged (step S229 of FIG. 11).

After determination of the delay varying width Y, the delay varying width Y is added to both the first delay value $\tau1$ and the second delay value $\tau2$ to calculate a new first delay value $\tau1$ and second delay value $\tau2$ (step S230 of FIG. 11), and the first correlation value $R\tau1$ and the second correlation value $R\tau2$ at the new first delay value $\tau1$ and second delay value $\tau2$ are acquired (step S221 of FIG. 11).

Figure 12:
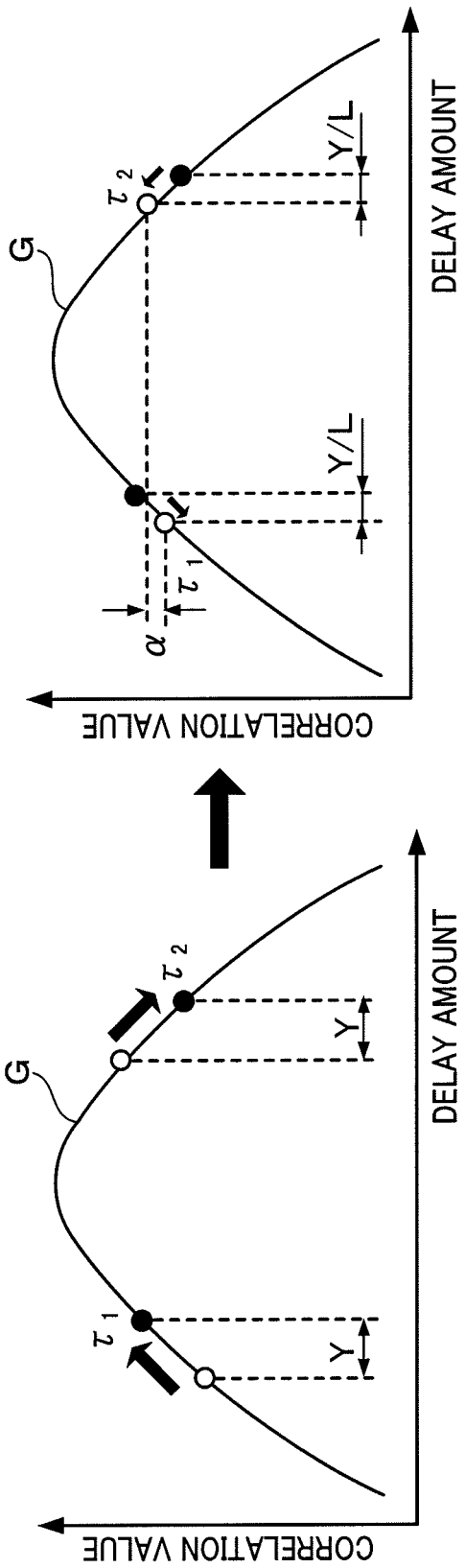
FIGS. 12A and 12B are views illustrating a process for high-resolution adjustment according to the second embodiment.

FIGS. 12A and 12B are views illustrating a process for high-resolution adjustment according to the present embodiment.

In the initial state represented by the open circles in FIG. 12A, the first correlation value $R\tau1$ of the first delay value $\tau1$ is smaller than the second correlation value $R\tau2$ of the second delay value $\tau2$ (step S223 of FIG. 11: Yes), so the delay varying width Y is set to a positive value (step S224 of FIG. 11) and the delay values $\tau1$ and $\tau2$ are shifted by the amount of the delay varying width Y in the positive direction.

Subsequently, correlation values $R\tau1$ and $R\tau2$ at the new delay values $\tau1$ and $\tau2$ plotted by the filled circles in FIGS. 12(A) and 12(B) are calculated (step S221 of FIG. 11), and the new correlation values $R\tau1$ and $R\tau2$ are compared to each other. When the new correlation values $R\tau1$ and $R\tau2$ are compared to each other, the first correlation value $R\tau1$ of the first delay value $\tau1$ is greater than the second correlation value $R\tau2$ of the second delay value $\tau2$ (step S223 of FIG. 11: No), so the delay varying width Y is set to a negative value (step S225 of FIG. 11). Further, the sign of the delay varying width Y is changed from positive to negative (step S226 of FIG. 11: Yes), so the delay varying width Y is multiplied by 1/L (step S227 of FIG. 11). As a result, as illustrated in FIG. 12B, the previous delay values $\tau1$ and $\tau2$ plotted by the filled circles are shifted in the minus direction by an amount of the delay varying width Y that is narrower than the delay varying width Y of FIG. 12A.

The above process is repeated until the absolute value of difference between the first correlation value $R\tau1$ and the second correlation value $R\tau2$ becomes equal to or smaller than the permissible value $\alpha$ (step S222 of FIG. 11).

Here, relative to the above-described basic embodiment of delay amount estimating apparatus, an applied embodiment may be preferably used in which the delay value search section varies both the first delay value and second delay value every first delay width so that a greater one of a correlation value of the first delay value and a correlation value of the second delay value is decreased and also a smaller one thereof is increased, until the magnitude relation between the correlation value of the first delay value varied and the correlation value of the second delay value varied has been reversed. Then, after the magnitude relation has been reversed, the delay value search section varies both the first delay value and the second delay value by a second delay width smaller than the first delay width so that a greater one of the correlation value of the first delay value and a correlation value of the second delay value is decreased and also a smaller one thereof is increased, until the magnitude relation between a correlation value of the varied first delay value and a correlation value of the varied second delay value has been reversed. Then this process is repeated, whereby the first delay value and the second delay value at which the correlation value of the first delay value and the correlation value of the second delay value become equal to each other may be determined.

According to the applied embodiment of the delay amount estimating apparatus, while both the first delay value $\tau1$ and the second delay value $\tau2$ are shifted by a given delay varying width Y in the same direction, the magnitude relation between first correlation value $R\tau1$ and second correlation value $R\tau2$ is compared, and after the magnitude relation has been reversed, the process of decreasing both the first delay value $\tau1$ and the second delay value $\tau2$ by a delay width Y/L smaller than the previous delay width Y is repeated, whereby the first delay value $\tau1$ and the second delay value $\tau2$ at which the same correlation value is provided can be found quickly.

According to the present embodiment, also, an intermediate delay value $(\tau1+\tau2)/2$ between the first delay value $\tau1$ and the second delay value $\tau2$ found is determined as an optimum delay amount (step S231 of FIG. 11).

In this way, according to the present embodiment, the speed of the maximum correlation value search process and the high-resolution adjustment process may be improved, so that an optimum delay amount can be calculated quickly.

The above description is about the second embodiment. Now, a third embodiment will be described. The third embodiment has the same configuration as the first embodiment, but is different from the first embodiment only in the high-resolution adjustment process method. Accordingly, FIG. 3 is used again for description of the third embodiment, and only the differences will be described below.

Figure 13:
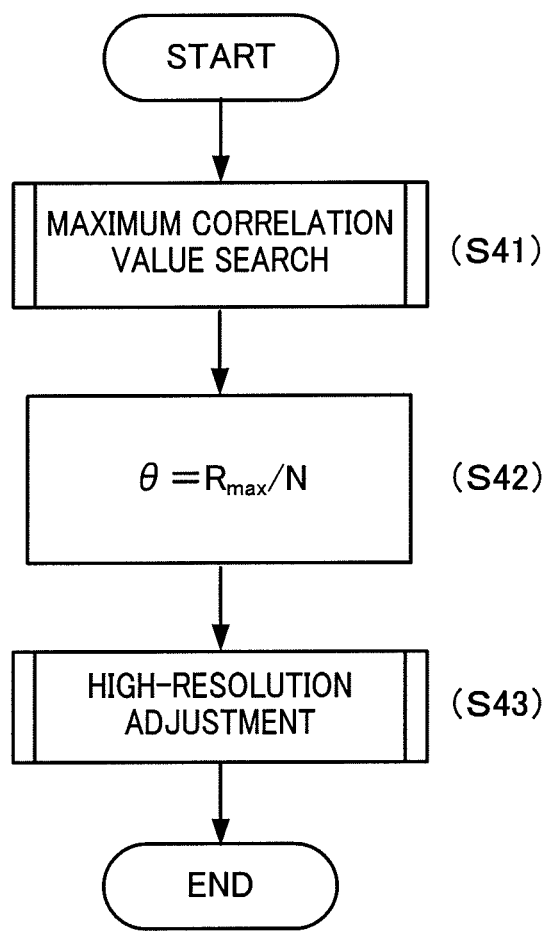
FIG. 13 is a flowchart illustrating a sequence of processes for calculating an optimal delay amount according to a third embodiment.

FIG. 13 is a flowchart illustrating a sequence of processes for calculating an optimum delay amount according to the third embodiment.

According to the present embodiment, similar to the first embodiment illustrated in FIG. 6, first the maximum correlation value search process is executed (step S41 of FIG. 13) to determine a maximum correlation value Rmax.

Subsequently, a comparative correlation value $\theta$ (=Rmax/N) obtained by multiplying the maximum correlation value Rmax by 1/N is determined (step S42 of FIG. 13).

Subsequently, the first delay value $\tau1$ and the second delay value $\tau2$ at which the comparative correlation value $\theta$ is provided are found, and an intermediate delay value between the first delay value $\tau1$ and the second delay value $\tau2$ thus found is determined as an optimum delay amount $\tau$ (high-resolution adjustment process: step S43 of FIG. 13).

Figure 14:
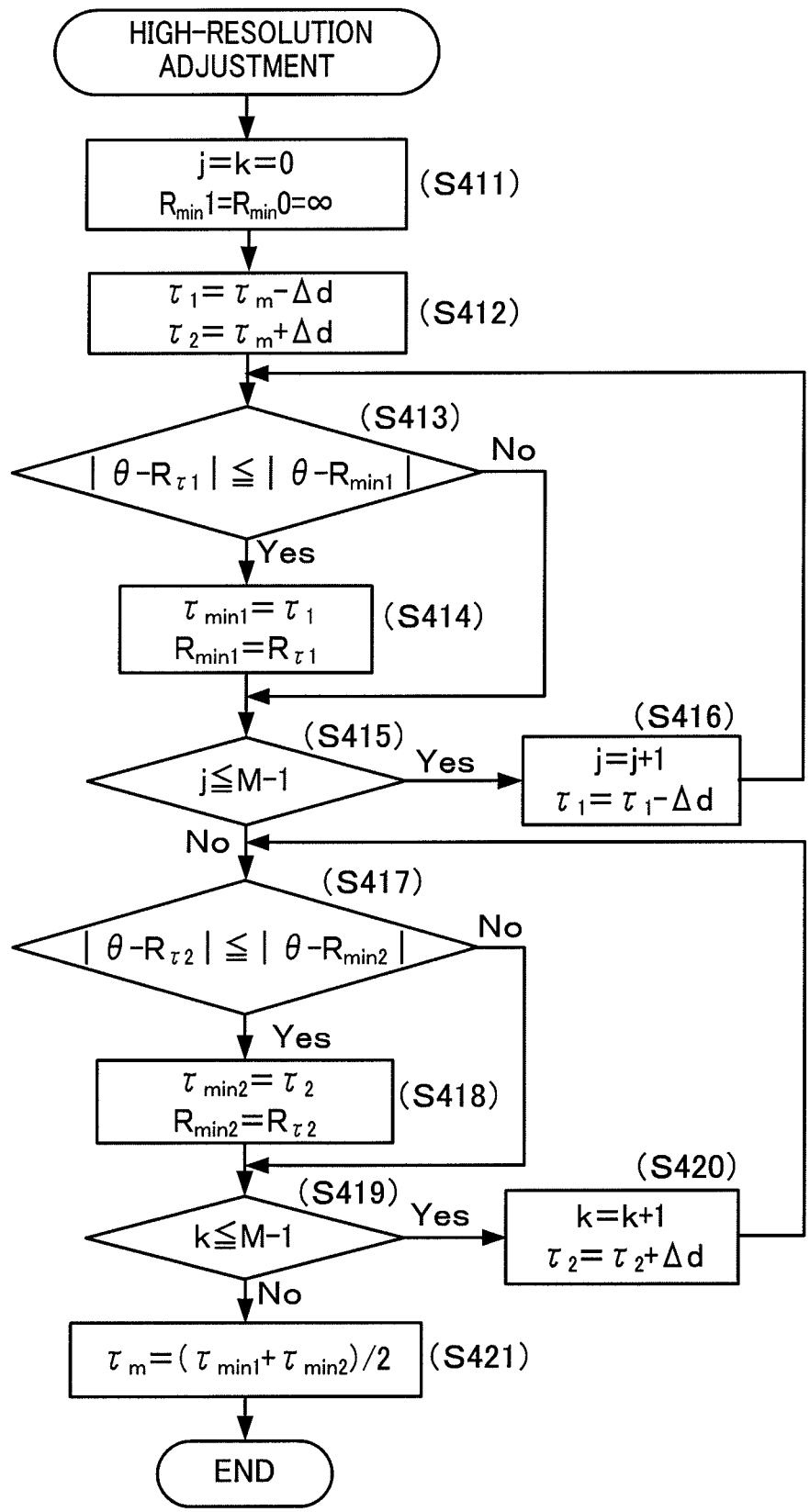
FIG. 14 is a flowchart illustrating a sequence of processes for high-resolution adjustment according to the third embodiment.

FIG. 14 is a flowchart illustrating a sequence of processes for high-resolution adjustment according to the third embodiment.

In the high-resolution adjustment processes according to the third embodiment, upon finding the first delay value $\tau 1$ and the second delay value $\tau 2$ at which the comparative correlation value $\theta$ is provided, the initial values of two approximate correlation values Rmin1 and Rmin2 currently closest to the comparative correlation value $\theta$ are set to "∞", and the initial values of the number of comparison times i and j are set to "0" (step S411 of FIG. 14).

Figure 15:
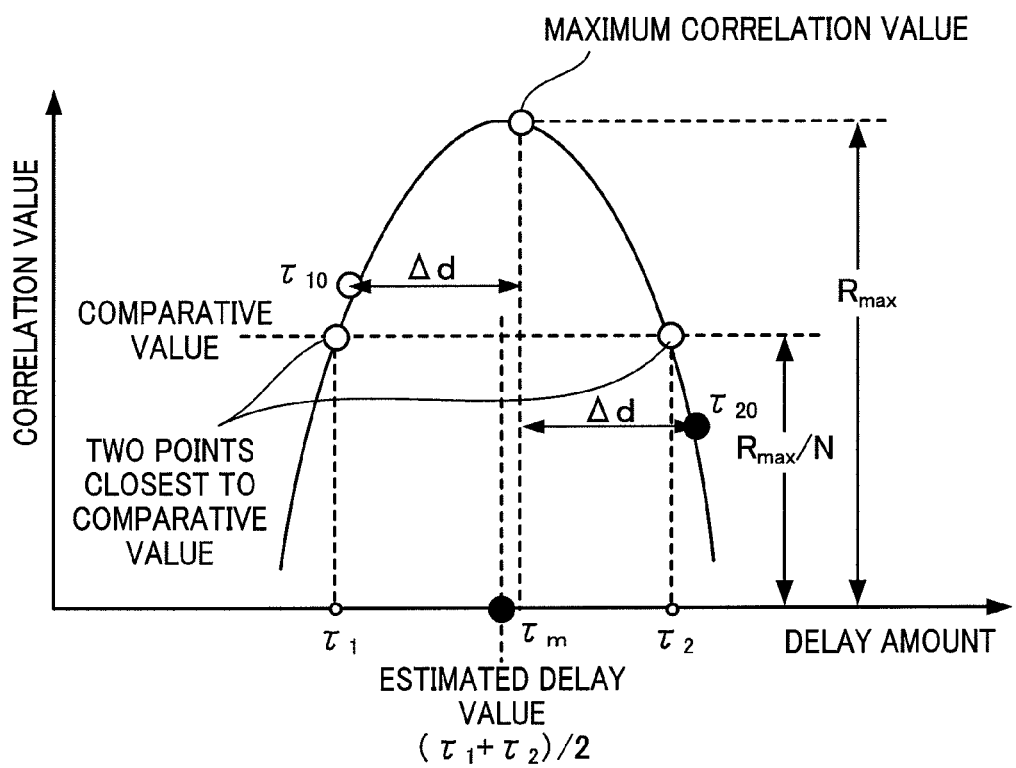
FIG. 15 is a view illustrating a process for high-resolution adjustment according to the third embodiment.

FIG. 15 is a view illustrating a process for high-resolution adjustment according to the third embodiment.

In the high-resolution adjustment process according to the present embodiment, as illustrated in FIG. 15, initial values $\tau 10$ and $\tau 20$ of the first delay value $\tau 1$ and the second delay value $\tau 2$ are determined so that the distances from the delay setting value $\tau m$ at which the maximum correlation value Rmax is provided to the initial values $\tau 10$ and $\tau 20$ are equal to each other, and the first delay value $\tau 1$ and the second delay value $\tau 2$ are varied to determine the first delay value $\tau 1$ and the second delay value $\tau 2$ at which respective correlation values are equal to the comparative correlation value $\theta$ (Rmax/N).

First, the initial value $\tau 10$ of the first delay value $\tau 1$ is set to a value ($\tau m-\Delta d$) obtained by subtracting a given delay value varying width $\Delta d$ from the delay setting value $\tau m$ at which the maximum correlation value Rmax calculated in step S41 of FIG. 13 is provided; and the initial value $\tau 20$ of the second delay value $\tau 2$ is set to the value ($\tau m+\Delta d$) obtained by adding the delay value varying width $\Delta d$ to the delay setting value $\tau m$ (step S412 of FIG. 14).

After the initial values of the first delay value $\tau 1$ and the second delay value $\tau 2$ have been set, firstly, the smaller first delay value $\tau 1$ is found.

The first correlation value R$\tau 1$ at the current first delay value $\tau 1$ is acquired from the line G illustrated in FIG. 4, and the absolute value ($|\theta - R\tau 1|$) of the difference between the comparative correlation value $\theta$ and the first correlation value R$\tau 1$ is compared to the absolute value ($|\theta - Rmin1|$) of the difference between the comparative correlation value $\theta$ and the approximate correlation value Rmin1. If the absolute value of the difference between the comparative correlation value $\theta$ and the first correlation value R$\tau 1$ is equal to or smaller than the absolute value of the difference between comparative correlation value $\theta$ and the approximate correlation value Rmin1 (step S413 of FIG. 14: Yes), the current first correlation value R$\tau 1$ is closer to the comparative correlation value $\theta$ than the approximate correlation value Rmin1, and thus the current first correlation value R$\tau 1$ is set as the new approximate correlation value Rmin1 and the first delay value $\tau 1$ is set as the delay value $\tau min1$ at which the approximate correlation value Rmin1 is provided (step S414 of FIG. 14).

If the number of comparison times j is equal to or smaller than (M−1) (M being a given number of times) (step S415 of FIG. 14: Yes), the number of comparison times j is incremented, so that the delay value $\tau 1$ for the first correlation value R$\tau 1$ is shifted by the given delay value varying width $\Delta d$ (step S416 of FIG. 14).

The above process is repeated until the number of comparison times j reaches the given number of times M.

The delay value $\tau 1$ of the first correlation value R$\tau 1$ illustrated in FIG. 15 is shifted every delay value varying width $\Delta d$, and upon the number of comparison times j reaching the given number of times M, the first correlation value R$\tau 1$ closest to the comparative correlation value $\theta$ is set as the approximate correlation value Rmin1, and the first delay value $\tau 1$ is set as the delay value $\tau min1$ at which the approximate correlation value Rmin1 is provided.

After completion of searching for and finding the first delay value $\tau 1$, the second delay value $\tau 2$ being the greater one is found in the same way.

The absolute value ($|\theta - R\tau 2|$) of the difference between the comparative correlation value $\theta$ and the second correlation value R$\tau 2$ at the current second delay value $\tau 2$ is compared to the absolute value ($|\theta - Rmin2|$) of the difference between the comparative correlation value $\theta$ and the approximate correlation value Rmin2. If the absolute value of the difference between the comparative correlation value $\theta$ and the second correlation value R$\tau 2$ is equal to or smaller than the absolute value of the difference between the comparative correlation value $\theta$ and the approximate correlation value Rmin2 (step S417 of FIG. 14: Yes), the current second correlation value R$\tau 2$ is set as the new approximate correlation value Rmin2, and the second delay value $\tau 2$ is set as the delay value $\tau min2$ at which the approximate correlation value Rmin2 is provided (step S418 of FIG. 14).

If the number of comparison times k is equal to or smaller than (M−1) (M being the given number of times) (step S419 of FIG. 14: Yes), the number of comparison times k is incremented, so that the delay value $\tau 2$ of the second correlation value R$\tau 2$ is shifted by the given delay value varying width $\Delta d$ (step S420 of FIG. 14).

The above process is repeated until the number of comparison times k reaches the given number of times M.

When the first delay value $\tau 1$ ($\tau min1$) and the second delay value $\tau 2$ ($\tau min2$) at which respective correlation values R$\tau 1$ and R$\tau 2$ are equal to the comparative correlation value $\theta$ are acquired, an intermediate delay value between the first delay value $\tau 1$ ($\tau min1$) and the second delay value $\tau 2$ ($\tau min2$) is determined as the optimum delay amount $\tau$ (step S421 of FIG. 14).

Here, relative to the above-described basic embodiment of delay amount estimating apparatus, an applied embodiment may be preferably used which includes a maximum correlation value calculating section that calculates a correlation between the input signal and the feedback signal and thereby calculates a maximum correlation value, and in which the delay value search section finds a first delay value being smaller than a delay setting value at which the maximum correlation value between the input signal and feedback signal is provided, and also finds a second delay value being greater than the delay setting value, wherein a comparative correlation value set based on the maximum correlation value calculated by the maximum correlation value calculating section is provided at the first delay value $\tau 1$ and second delay value $\tau 2$.

The first delay value $\tau 1$ and the second delay value $\tau 2$ at which comparative correlation value $\theta$ is provided are found, so even when a maximum correlation value cannot be acquired with high accuracy due to a variation in the correlation value, the optimum delay value $\tau m$ may be calculated with high accuracy.

The above description is about the third embodiment. Now, a fourth embodiment will be described. The fourth embodiment is different from the first embodiment in that the calculation of the maximum correlation value is not performed, but has substantially the same configuration as the first embodiment. Thus, the same reference numerals are applied to parts corresponding to those of the first embodiment, and an explanation thereof is omitted. Only the differences will be described below.

Figure 16:
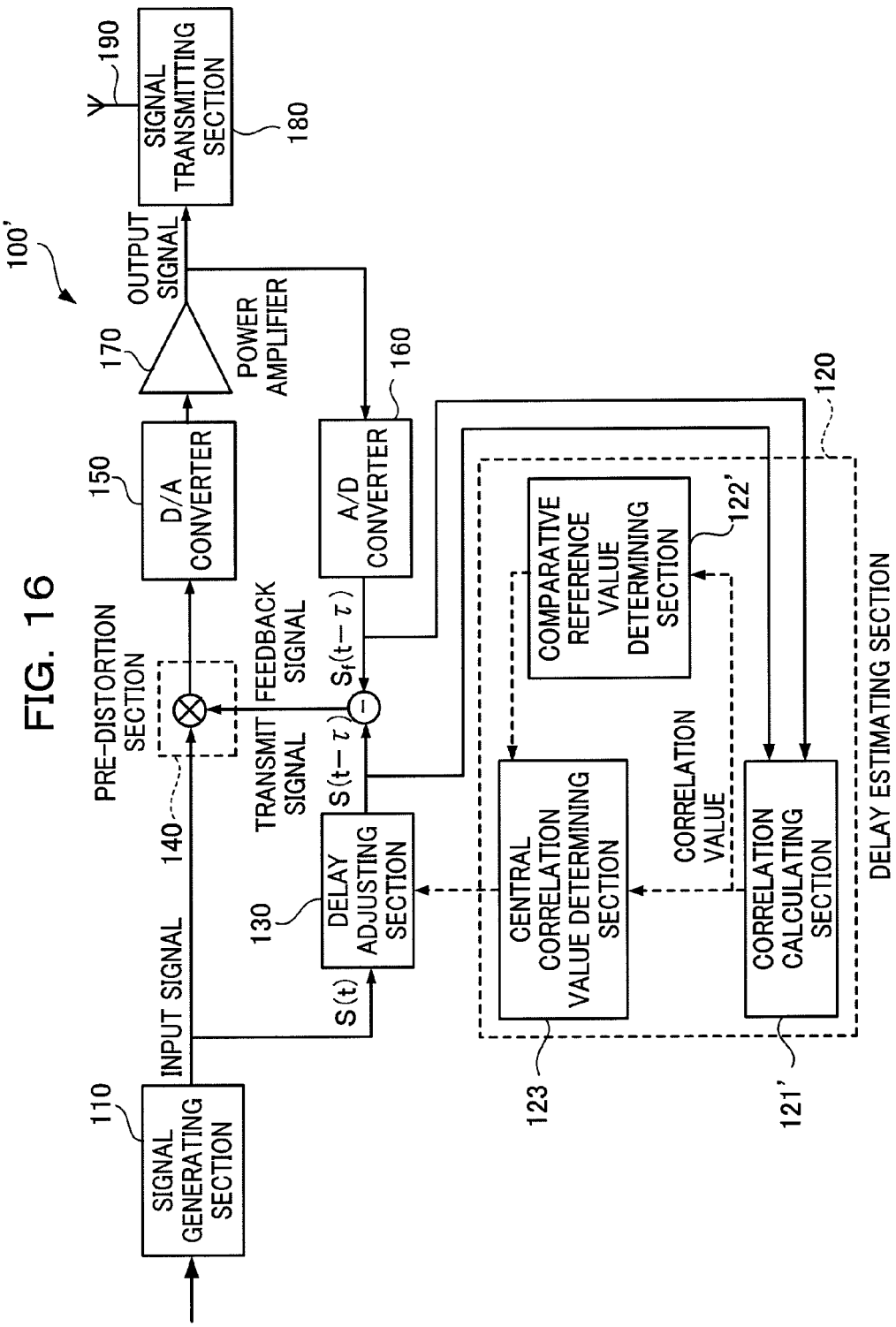
FIG. 16 is a schematic configuration diagram of a signal transmitting apparatus according to a fourth embodiment.

FIG. 16 is a schematic configuration diagram of a signal transmitting apparatus according to the fourth embodiment.

A signal transmitting apparatus 100' illustrated in FIG. 16 has substantially the same configuration as the signal transmitting apparatus 100 according to the first embodiment illustrated in FIG. 3, but processes performed by the correlation calculating section 121' and the comparative reference value determining section 122' are different from the first embodiment, and the calculation of maximum correlation value is not performed. The correlation calculating section 121' calculates a correlation value between an input signal S(t) and a feedback signal S(t−τ) while varying a delay value τ. The comparative reference value determining section 122' calculates an average power value of the input signal and determines a first delay value τ1 and a second delay value τ2 at which a comparative correlation value θ based on the average power value is provided.

Figures 17, 18:
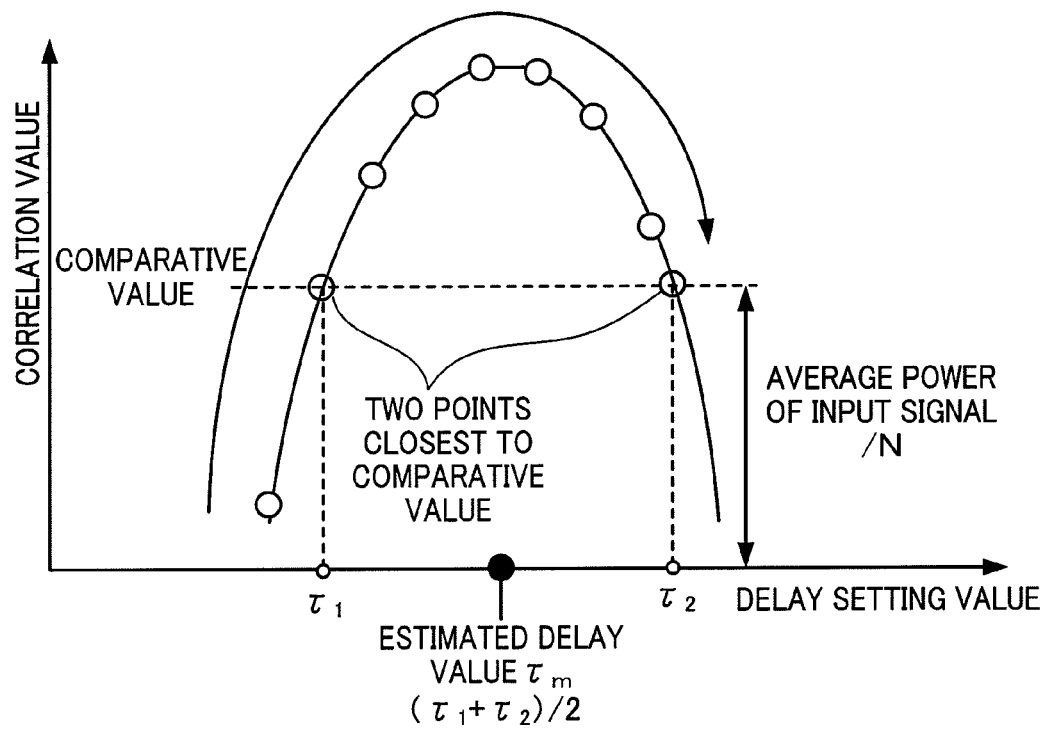
FIG. 17 is an expression for calculating correlation between the input signal and feedback signal.
FIG. 18 is a view illustrating a process for estimating a delay amount according to the fourth embodiment.

FIG. 17 is an expression for calculating the correlation between the input signal and the feedback signal.

An average value E {S(ti)×S'(ti)*} of the correlation value between the input signal S(ti) and the feedback signal S'(ti)* is, as illustrated in FIG. 17, expressed as a product of an average power Σ (I2+Q2)/n and a coefficient $\alpha e^{j\theta}$. Here, the coefficient $\alpha e^{j\theta}$ is much smaller than the average power Σ (I2+Q2)/n so the coefficient $\alpha e^{j\theta}$ may be neglected.

According to the third embodiment illustrated in FIG. 13, first, a maximum correlation value Rmax is calculated, and the first delay value τ1 and the second delay value τ2 at which the comparative correlation value θ (θ=Rmax/N) based on the maximum correlation value Rmax are found. However, as illustrated in FIG. 17, the average value of the correlation value between the input signal and the feedback signal is substantially equal to the average power of the input signal, so the comparative correlation value θ can be set without calculating the maximum correlation value Rmax.

FIG. 18 is a view illustrating a processes for estimating a delay amount according to the present embodiment.

The correlation calculating section 121' illustrated in FIG. 16 calculates a correlation value between the input signal and feedback signal while increasing the delay amount of the feedback signal relative to the input signal for every specific amount. The calculated correlation values are sent in order to the comparative reference value determining section 122'.

The comparative reference value determining section 122' calculates an average power of the input signal and determines a value of 1/N of the average power as the comparative correlation value θ. Further, the comparative reference value determining section 122' compares comparative correlation value θ with the correlation values sent in order from the correlation calculating section 121' and selects two correlation values τ1 and τ2 closest to the comparative correlation value θ.

The central correlation value determining section 123 determines an intermediate delay value between the two selected correlation values τ1 and τ2 as an optimum delay amount.

Here, relative to the above-described basic embodiment of delay amount estimating apparatus, an applied embodiment may be preferably used which includes an average power value calculating section that calculates an average power value of the input signal, and in which the delay value search section finds a first delay value which is smaller than a delay setting value at which the maximum correlation value between the input signal and feedback signal is provided, and also finds a second delay value which is greater than the delay setting value, wherein a comparative correlation value set based on the average power value by the average power value calculating section is provided at the first delay value and the second delay value.

Since the average power value of the input signal is used, the maximum correlation value does not need to be calculated, allowing improvement in the process speed for calculating the optimum delay value τm.

The above description is about the fourth embodiment. Now, a fifth embodiment will be described. The fifth embodiment also has the same configuration as the first embodiment, so FIG. 3 is used again for description of the fifth embodiment, and only the differences will be described below.

According to the present embodiment, first, a high-speed maximum correlation value search process similar to that of the second embodiment illustrated in FIG. 9 is executed, and thereafter a comparative correlation value θ (Rmax/N) is, similar to the third embodiment illustrated in FIG. 13, determined based on the maximum correlation value Rmax acquired. Then, a high-speed high-resolution adjustment process is executed, whereby a first delay value τ1 and a second delay value τ2 at which a comparative correlation value θ is provided are selected, and an intermediate value between the first delay value τ1 and the second delay value τ2 is determined as an optimum delay value.

FIG. 19 is a flowchart illustrating a sequence of processes for high-speed high-resolution adjustment.

First, the initial values of two approximate correlation values Rmin1 and Rmin2 currently closest to the comparative correlation value θ are set to "∞"; and a permissible value α of the correlation value is set to a given value "α₀" (step S511 of FIG. 19).

Subsequently, a given delay varying width Y is set to a negative value, and the initial value of the first delay value τ1 is set to a value obtained by adding the delay varying width Y to the delay setting value τm at which the maximum correlation value Rmax is provided (step S512 of FIG. 19). That is, the first delay value τ1 is set to a value smaller than the delay setting value τm by the delay value varying width Y.

Subsequently, the first correlation value Rτ1 at the current first delay value τ1 is acquired, and the absolute value |θ−Rτ1| of the difference between the comparative correlation value θ and the first correlation value Rτ1 is compared to the absolute value |τ−Rmin1| of the difference between the comparative correlation value θ and the approximate correlation value Rmin1. If the absolute value of the difference between the comparative correlation value θ and the first correlation value Rτ1 is equal to or smaller than the absolute value of the difference between the comparative correlation value θ and the approximate correlation value Rmin1 (step S513 of FIG. 19: Yes), the current first correlation value Rτ1 is closer to the comparative correlation value θ than the approximate correlation value Rmin1 and thus set as the new approximate correlation value Rmin1, and the first delay value τ1 is set as the delay value τmin1 at which the approximate correlation value Rmin1 is provided (step S514 of FIG. 19).

Further, if the absolute value |θ−Rmin1| of the difference between the comparative correlation value θ and the current approximate correlation value Rmin1 is greater than the permissible value α (step S515 of FIG. 19: No), it is determined whether or not the approximate correlation value Rmin1 is greater than the comparative correlation value θ, that is, whether or not the magnitude relation between the approximate correlation value Rmin1 and the comparative correlation value θ has been reversed. If the magnitude relation has been reversed (step S516 of FIG. 19: Yes), the delay value varying width Y is multiplied by 1/L (L being an integer greater than 1) and also the sign thereof is changed (step S517 of FIG. 19); and if the absolute value of the delay value varying width Y becomes smaller than "1" (step S518 of FIG. 19: Yes), the absolute value of the delay varying width Y is set to "1" (step S519 of FIG. 19).

Further, the first correlation value Rτ1 is changed to a value obtained by adding the delay value varying width Y to the current first correlation value Rτ1 (step S520 of FIG. 19), and the absolute value |θ−Rτ1| of the difference between the comparative correlation value θ and the new first correlation value Rτ1 is compared to the absolute value |θ−Rmin1| of the difference between the comparative correlation value θ and the current approximate correlation value Rmin1 (step S513 of FIG. 19).

The above processes are repeated until the absolute value |θ−Rmin1| of the difference between the comparative correlation value θ and the current approximate correlation value Rmin1 becomes equal to or smaller than the permissible value α (step S515 of FIG. 19: Yes).

In the high-resolution adjustment process according to the present embodiment, first, while the delay value is drastically varied, the first delay value τ1 at which the comparative correlation value θ is provided is found; and when the correlation value Rτ1 of the first delay value τ1 exceeds the comparative correlation value θ, the delay value varying width Y is multiplied by 1/N and also the sign thereof is reversed, and while the delay value is varied little by little so that the correlation value Rτ1 approaches the comparative correlation value θ, first delay value τ1 is found.

After completion of searching for the first delay value τ1, a search for second the delay value τ2 is started.

First, the delay varying width Y is set to a positive value, and the initial value of second delay value τ2 is set to a value obtained by adding the delay varying width Y to the delay setting value τm (step S512 of FIG. 19). That is, the second delay value τ2 is set to a value greater than the delay setting value τm by the delay value varying width Y.

Subsequently, the absolute value |θ−Rτ2| of the difference between the comparative correlation value θ and the current second correlation value Rτ2 is compared to the absolute value |θ−Rmin2| of the difference between the comparative correlation value θ and the approximate correlation value Rmin2. If the absolute value of the difference between the comparative correlation value θ and the second correlation value Rτ2 is equal to or smaller than the absolute value of the difference between the comparative correlation value θ and the approximate correlation value Rmin2 (step S522 of FIG. 19: Yes), the current second correlation value Rτ2 is set as the new approximate correlation value Rmin2, and the second delay value τ2 is set as the delay value τmin2 at which the approximate correlation value Rmin2 is provided (step S523 of FIG. 19).

If the absolute value |θ−Rmin2| of the difference between the comparative correlation value θ and the current approximate correlation value Rmin2 is greater than the permissible value α (step S524 of FIG. 19: No), it is determined whether or not the magnitude relation between the approximate correlation value Rmin2 and the comparative correlation value θ has been reversed. After the magnitude relation has been reversed (step S525 of FIG. 19: Yes), the delay value varying width Y is multiplied by 1/L (L being an integer greater than 1) and also the sign thereof is changed (step S526 of FIG. 19); and when the absolute value of the delay value varying width Y becomes smaller than "1" (step S527 of FIG. 19: Yes), the absolute value of the delay varying width Y is set to "1" (step S528 of FIG. 19).

Further, the second correlation value Rτ2 is changed to a value obtained by adding the delay value varying width Y to the current second correlation value Rτ2 (step S529 of FIG. 19), and the above processes are repeated until the absolute value |θ−Rmin2| of the difference between the comparative correlation value θ and the current approximate correlation value Rmin2 becomes equal to or smaller than the permissible value α.

When the first delay value τ1 (τmin1) and the second delay value τ2 (τmin2) at which respective correlation values Rτ1 and Rτ2 are equal to the comparative correlation value θ are acquired, an intermediate delay value between the first delay value τ1 and the second delay value τ2 is determined as an optimum delay value (step S530 of FIG. 19).

Here, relative to the above described basic embodiment of the delay amount estimating apparatus, an applied embodiment is preferably used in which the delay value search section determines, with respect to each of the first delay value and the second delay value, the magnitude relation between a correlation value of the delay value and a comparative correlation value, and varies the delay value every first delay width so that the correlation value of the delay value approaches the comparative correlation value until the magnitude relation between the correlation value of the varied delay value and the comparative correlation value has been reversed. Then, after the magnitude relation has been reversed, the delay value search section varies the delay value by a second delay width smaller than the first delay width so that the correlation value of the delay value approaches the comparative correlation value until the magnitude relation between the correlation value of the varied delay value and the comparative correlation value has been reversed, and the above processes are repeated, whereby the first delay value and the second delay value at which the respective correlation values are equal to the comparative correlation value are determined.

First, while drastically changing the delay value, a first delay value and a second delay value at which respective correlation values are equal to the comparative correlation value are found. Then after the magnitude relation between the correlation value and the comparative correlation value has been reversed, the search is continued while changing the delay value little by little, so the correlation values at all the delay values do not need to be compared with the comparative correlation value, allowing speeding up of process.

In the above-described delay amount estimating apparatus, a first delay value and a second delay value at which respective correlation values are equal to each other are found, a delay setting value at which a maximum correlation value is provided being between the first delay value and second delay value; and an intermediate delay value between the first delay value and second delay value is estimated as a delay amount of the feedback signal relative to the input signal. Consequently, even when a variation in correlation value occurs, a delay amount of the feedback signal relative to the input signal may be estimated with high accuracy.

In the above-described signal transmitting apparatus, a delay amount of the feedback signal relative to the input signal may be estimated with high accuracy, so an input signal and a feedback signal may be supplied to a distortion correcting circuit at the same time. Accordingly, the distortion of the output signal from the amplifier circuit can be corrected with high accuracy, allowing reduction of power leakage to adjacent channels.

As described above, in the delay amount estimating apparatus and signal transmitting apparatus of the present embodiments, a delay amount of the feedback signal relative to the input signal may be estimated with high accuracy.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A delay amount estimating apparatus comprising:
   a delay value search section that searches for a first delay value at which a first correlation value between an input signal and a feedback signal is provided and that searches for second delay value at which a second correlation value between the input signal and the feedback signal is provided, so that the first delay value is smaller than a delay setting value at which a given correlation value between the input signal and the feedback signal is provided and so that the second delay value is greater than the delay setting value, the first correlation value and the second correlation value satisfying a given condition; and
   a delay estimating section that estimates a delay amount of the feedback signal relative to the input signal based on the first delay value and the second delay value.

2. The delay amount estimating apparatus according to claim 1, wherein the delay value search section searches for the first delay value smaller than the delay setting value at which a maximum correlation value between the input signal and the feedback signal is provided, and also for the second delay value greater than the delay setting value.

3. The delay amount estimating apparatus according to claim 1, wherein the delay estimating section estimates, as the delay amount of the feedback signal relative to the input signal, an intermediate delay value $(\tau 1+\tau 2)/2$ between the first delay value $\tau 1$ and the second delay value $\tau 2$.

4. The delay amount estimating apparatus according to claim 1, wherein the delay value search section searches for the first delay value and the second delay value, the first and second correlation values being substantially equal to each other.

5. The delay amount estimating apparatus according to claim 1, further comprising:
   a maximum correlation value calculating section that makes a calculation of a correlation between the input signal and the feedback signal and thereby calculates the maximum correlation value;
   wherein the delay value search section searches for the first delay value smaller than the delay setting value at which a maximum correlation value between the input signal and the feedback signal is provided, and also for the second delay value greater than the delay setting value, the first and second correlation values being a comparative correlation value which is set based on the maximum correlation value.

6. The delay amount estimating apparatus according to claim 5, wherein the delay value search section performs a process to determine, for both the first delay value and the second delay value, a magnitude relation between a comparative correlation value and a correlation value of the delay value; performs a process to vary the delay value every first delay width so that the correlation value of the delay value approaches the comparative correlation value until the magnitude relation is reversed; performs a process to vary the delay value every second delay width smaller than the first delay width so that the correlation value of the delay value approaches the comparative correlation value until the magnitude relation is reversed; and the processes are repeated so that the first delay value and the second delay value are determined.

7. The delay amount estimating apparatus according to claim 1, further comprising:
   an average power value calculating section that calculates an average power value of the input signal;
   wherein the delay value search section searches for the first delay value and the second delay value, the first and second correlation values being a comparative correlation value which is set based on the average power value.

8. The delay amount estimating apparatus according to claim 1, further comprising:
   an initial delay value setting section that sets a first initial delay value $\tau 10$, which is an initial value of the first delay value $\tau 1$, and a second initial delay value $\tau 20$, which is an initial value of the second delay value $\tau 2$;
   wherein the delay value search section searches for the first delay value $\tau 1$ and the second delay value $\tau 2$, by varying at least one of the first delay value $\tau 1$ and the second delay value $\tau 2$.

9. The delay amount estimating apparatus according to claim 8, further comprising:
   a maximum correlation value calculating section that calculates a correlation between the input signal and feedback signal and thereby calculates the maximum correlation value;
   wherein the initial delay value setting section sets, as one of the first initial delay value $\tau 10$ and the second initial delay value $\tau 20$, a delay value at which a correlation value between the input signal and the feedback signal becomes a comparative correlation value which is set based on the maximum correlation value, and sets, as the other initial delay value, a delay value separated from a delay setting value at which the maximum correlation value is provided, by a delay width which is the same as the width from the delay setting value to the one initial delay value in an opposite direction relative to the one initial delay value.

10. The delay amount estimating apparatus according to claim 8, wherein the delay value search section varies the first delay value and the second delay value while the delay value width $(\tau 2-\tau 1)$ between the first delay value $\tau 1$ and the second delay value $\tau 2$ is fixed at the delay value width $(\tau 20-\tau 10)$, which is a difference between the first initial delay value $\tau 10$ and the second initial delay value $\tau 20$, and searches for the first delay value $\tau 1$ and the second delay value $\tau 2$ at which the respective correlation values become substantially equal to each other.

11. The delay amount estimating apparatus according to claim 10, wherein the delay value search section performs a process to vary both the first delay value and the second delay value every first delay width so that a greater one of a correlation value of the first delay value and a correlation value of the second delay value is decreased, and also a smaller one of a correlation value of the first delay value or a correlation value of the second delay value is increased, until a magnitude relation between the correlation value of the varied first delay value and the correlation value of the varied second delay value has been reversed; performs a process to vary both the first delay value and the second delay value every second delay width smaller than the first delay width so that a greater one of the correlation value of the first delay value and the correlation value of the second delay value is decreased and also a smaller one of the correlation value of the first delay value and the correlation value of the second delay value is increased, until the magnitude relation between the correlation value of the varied first delay value and the correlation value of the varied second delay value has been reversed, and the processes are repeated so that the first delay value and the second delay value are determined.

12. A signal transmitting apparatus comprising:
an amplifier circuit that amplifies an input signal;
a distortion correcting circuit that, based on a first signal produced from the input signal and a second signal produced from an output signal of the amplifier circuit, corrects the input signal so that an output signal with reduced distortion is outputted from the amplifier circuit, and supplies the input signal to the amplifier circuit;
a delay estimating circuit that estimates a delay amount of a feedback signal from the amplifier circuit relative to the input signal;
a delay circuit that delays the first signal based on the delay amount and supplies the delayed signal to the distortion correcting circuit; and
a transmitting circuit that transmits the signal amplified by the amplifier circuit; wherein
the delay estimating circuit comprises:
a delay value search section that searches for a first delay value at which a first correlation value between an input signal and a feedback signal is provided and that searches for a second delay value at which a second correlation value between the input signal and the feedback signal is provided, so that the first delay value is smaller than a delay setting value at which a given correlation value between the input signal and the feedback signal is provided and so that the second delay value is greater than the delay setting value, the first correlation value and the second correlation value satisfying a given condition; and
a delay estimating section that estimates a delay amount of the feedback signal relative to the input signal based on the first delay value and the second delay value.

13. The signal transmitting apparatus according to claim 12,
wherein the delay value search section searches for the first delay value smaller than the delay setting value at which a maximum correlation value between the input signal and the feedback signal is provided, and also for the second delay value greater than the delay setting value.

14. The signal transmitting apparatus according to claim 12, wherein the delay estimating section estimates, as the delay amount of the feedback signal relative to the input signal, an intermediate delay value $(\tau 1+\tau 2)/2$ between the first delay value $\tau 1$ and the second delay value $\tau 2$.

15. The delay amount estimating apparatus according to claim 12, wherein the delay value search section searches for the first delay value and the second delay value, the first and second correlation values being substantially equal to each other.

16. A delay amount estimating method comprising:
searching for a first delay value at which a first correlation value between an input signal and a feedback signal is provided and that searches for a second delay value at which a second correlation value between the input signal and the feedback signal is provided, so that the first delay value is smaller than a delay setting value at which a given correlation value between the input signal and the feedback signal is provided and so that the second delay value is greater than the delay setting value, the first correlation value and the second correlation value satisfying a given condition; and
estimating a delay amount of the feedback signal relative to the input signal based on the first delay value and the second delay value.

17. The delay amount estimating method according to claim 16, wherein the searching includes searching for the first delay value smaller than the delay setting value at which a maximum correlation value between the input signal and the feedback signal is provided, and also for the second delay value greater than the delay setting value.

18. The delay amount estimating method according to claim 16, wherein the estimating includes estimating, as the delay amount of the feedback signal relative to the input signal, an intermediate delay value $(\tau 1+\tau 2)/2$ between the first delay value $\tau 1$ and the second delay value $\tau 2$.

19. The delay amount estimating method according to claim 16, wherein the searching includes searching for the first delay value and the second delay value, the first and second correlation values being substantially equal to each other.

* * * * *